(12) United States Patent
Kato et al.

(10) Patent No.: US 9,140,603 B2
(45) Date of Patent: Sep. 22, 2015

(54) PHOTOELECTRIC CONVERSION ELEMENT, AND PHOTOELECTRIC CONVERSION APPARATUS AND IMAGE SENSING SYSTEM

(71) Applicant: CANON KABUSHIKI KAISHA, Tokyo (JP)

(72) Inventors: Taro Kato, Kawasaki (JP); Tadashi Sawayama, Machida (JP); Hiroshi Ikakura, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/274,529

(22) Filed: May 9, 2014

(65) Prior Publication Data

US 2014/0246569 A1 Sep. 4, 2014

Related U.S. Application Data

(63) Continuation of application No. 13/363,930, filed on Feb. 1, 2012, now Pat. No. 8,773,558.

(30) Foreign Application Priority Data

| Feb. 9, 2011 | (JP) | 2011-026344 |
| Jan. 5, 2012 | (JP) | 2012-000680 |
| Jan. 5, 2012 | (JP) | 2012-000681 |

(51) Int. Cl.
*H04N 5/335* (2011.01)
*G01J 1/42* (2006.01)
*H01L 27/146* (2006.01)

(52) U.S. Cl.
CPC ............. *G01J 1/42* (2013.01); *H01L 27/14627* (2013.01); *H01L 27/14629* (2013.01)

(58) Field of Classification Search
CPC ...................................... H04N 5/335
USPC ......... 348/280, 294, 308; 250/208.1; 257/432
See application file for complete search history.

(56) References Cited

U.S. PATENT DOCUMENTS

| 2008/0283728 A1* | 11/2008 | Inoue ......................... 250/208.1 |
| 2010/0244167 A1* | 9/2010 | Konno ............................ 257/432 |
| 2012/0200751 A1* | 8/2012 | Kato et al. .................... 348/294 |

FOREIGN PATENT DOCUMENTS

| CN | 101753862 A | 6/2010 |
| JP | 2008-166677 A | 7/2008 |

* cited by examiner

*Primary Examiner* — Tuan Ho
(74) *Attorney, Agent, or Firm* — Canon USA, Inc. IP Division

(57) ABSTRACT

A member for light path to a photoelectric conversion portion includes a middle portion, and a peripheral portion having a refractive index different from the refractive index of the middle portion, and within some plane in parallel with the light receiving surface of a photoelectric conversion portion, and within other plane closer to the light receiving surface than the some plane in parallel with the light receiving surface, the peripheral portion is continuous with the middle portion and surrounds the middle portion, and also the refractive index of the peripheral portion is higher than the refractive index of an insulator film, and the thickness of the peripheral portion within the other plane is smaller than the thickness of the peripheral portion within the some plane.

20 Claims, 11 Drawing Sheets

PHOTOELECTRIC CONVERSION ELEMENT, AND PHOTOELECTRIC CONVERSION APPARATUS AND IMAGE SENSING SYSTEM

CROSS-REFERENCE TO RELATED APPLICATION

This application is a Continuation of U.S. application Ser. No. 13/363,930, filed Feb. 1, 2012, which claims the benefit of Japanese Patent Application No. 2011-026344 filed Feb. 9, 2011, Japanese Patent Application No. 2012-000680 filed Jan. 5, 2012, and Japanese Patent Application No. 2012-000681 filed Jan. 5, 2012, which are hereby incorporated by reference herein in their entirety.

BACKGROUND OF THE INVENTION

1. Field of the Invention

The present invention relates to a photoelectric conversion apparatus having a light guiding path configuration.

2. Description of the Related Art

With a photoelectric conversion apparatus including multiple photoelectric conversion elements, in order to increase the number of photoelectric conversion portions, and/or to reduce the photoelectric conversion apparatus in size, the width of a light receiving surface has to be reduced. Accordingly, the sensitivity of the photoelectric conversion portions themselves may deteriorate. Therefore, the sensitivity of the photoelectric conversion elements can be improved by increasing the use efficiency of incident light.

In order to improve the use efficiency of incident light, it is effective to provide a light waveguide path onto the light receiving surface of a photoelectric conversion element (light receiving portion) as described in Japanese Patent Laid-Open No. 2008-166677.

SUMMARY OF THE INVENTION

A first embodiment of the present invention provides a photoelectric conversion element including: a photoelectric conversion portion; and a light path member which is provided onto the photoelectric conversion portion and surrounded with an insulator film; with the light path member including a first portion, and a second portion having the same stoichiometric composition as with the first portion, and also having a higher refractive index than the refractive index of the first portion; with the second portion being continuous with the first portion and surrounding the first portion, and also the refractive index of the first portion being higher than the refractive index of the insulator film, within some plane in parallel with the light receiving surface of the photoelectric conversion portion, and within other plane in parallel with the light receiving surface and closer to the light receiving surface than the some plane; and with the thickness of the second portion within the other plane being smaller than the thickness of the second portion within the some plane.

A second embodiment of the present invention provides a photoelectric conversion element including: a photoelectric conversion portion; and a light path member which is provided onto the photoelectric conversion portion and surrounded with an insulator film, the insulator film including a first insulator layer and a second insulator layer of silicon oxide or silicate glass; with the light path member including a first portion, and a second portion having a lower refractive index than the refractive index of the first portion; with the second portion being continuous with the first portion and surrounding the first portion, and also the refractive index of the second portion being higher than the refractive index of the insulator film within some plane in parallel with the light receiving surface of the photoelectric conversion portion, and within other plane in parallel with the light receiving surface and closer to the light receiving surface than the some plane, and with the thickness of the second portion within the other plane being smaller than the thickness of the second portion within the some plane.

Further features of the present invention will become apparent from the following description of exemplary embodiments with reference to the attached drawings.

DESCRIPTION OF THE EMBODIMENTS

Figure 1:
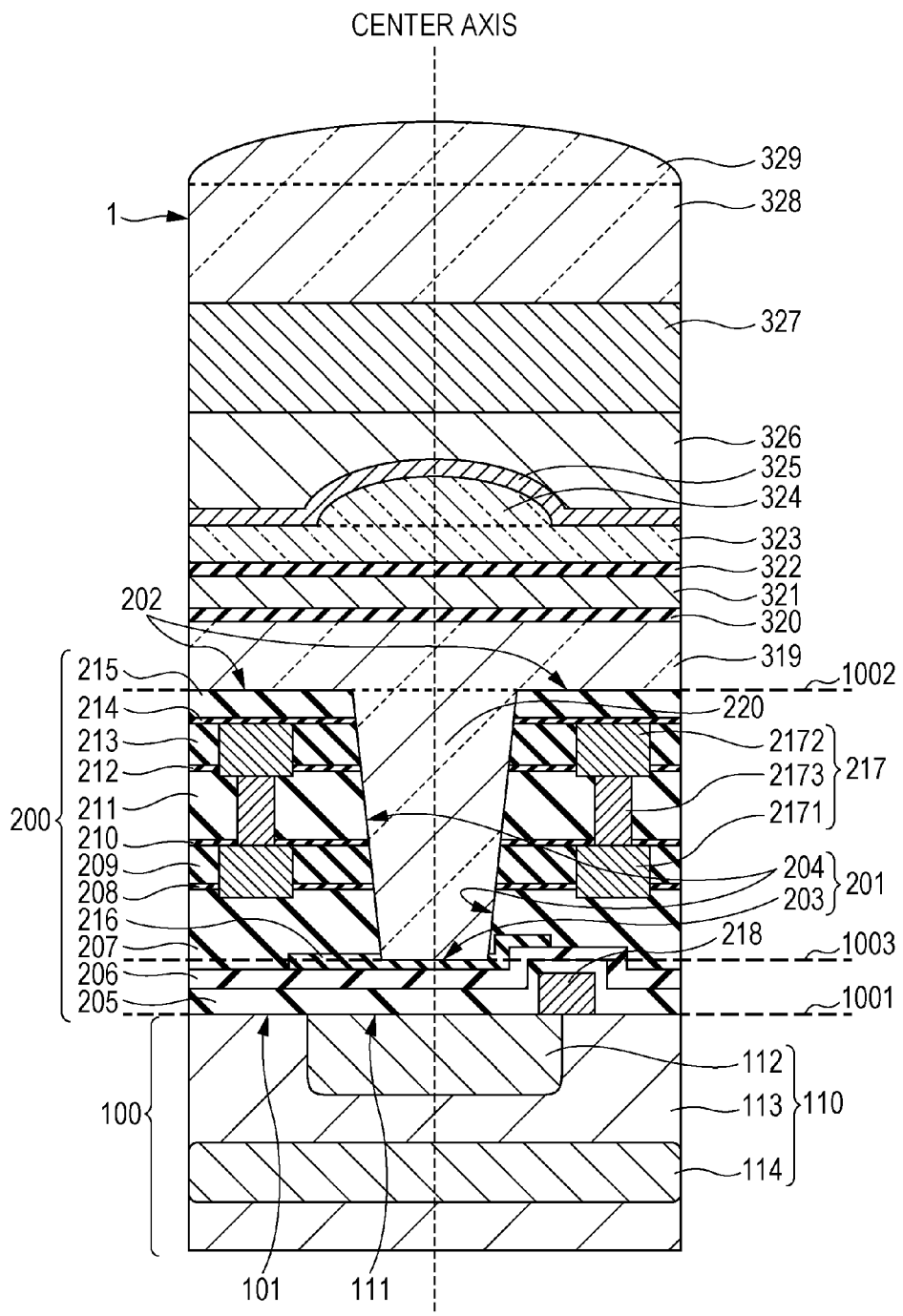
FIG. 1 is a cross-sectional schematic diagram for describing an example of a photoelectric conversion element.

First, the overview of a photoelectric conversion element 1 will be described with reference to FIG. 1. FIG. 1 is a cross-sectional schematic diagram representing an example of a photoelectric conversion element.

The photoelectric conversion element 1 includes a photoelectric conversion portion 110. The multiple photoelectric conversion elements 1 are arrayed in a one-dimensional or two-dimensional shape, thereby making up a photoelectric conversion apparatus. The photoelectric conversion apparatus will be described later with reference to FIG. 11, but the photoelectric conversion apparatus may further include a peripheral circuit for controlling the signals obtained from the photoelectric conversion elements 1.

The photoelectric conversion portion 110 is provided to a substrate 100. With a photoelectric conversion apparatus, one substrate 100 includes multiple photoelectric conversion portions 110, and each of the multiple photoelectric conversion portions 110 makes up a part of a separate photoelectric conversion element 1.

Of the photoelectric conversion portion 110, the upper side face on the drawing is a light receiving surface 111. An imaginary (geometrical) plane including the light receiving surface 111 will be referred to as a first plane 1001. Typically, the photoelectric conversion portion 110 is formed by introducing an impurity into a deeper portion than the principal face 101 of the semiconductor substrate 100. Therefore, typically, the light receiving surface 111 of the photoelectric conversion portion 110 substantially agrees with at least a part of the principal surface 101 of the substrate 100, and the first plane 1001 includes the principal surface 101 of the substrate 100.

However, by providing a hollow to the principal surface 101 of the semiconductor substrate 100, the photoelectric conversion portion 110 may be formed in a deeper portion than the bottom face of this hollow. Alternatively, a thin film having a MIS-type configuration or PIN-type configuration may be formed on the principal surface of a glass plate or the like. In these cases, the principal surface 101 of the substrate 100, and the light receiving surface 111 of the photoelectric conversion portion 110 do not always exist within the same plane.

At least an insulator film 200 which covers one principal surface 101 where the photoelectric conversion portion 110 is disposed of the substrate 100 is provided onto the substrate 100 (onto the principal surface 101). That is to say, the lower face of the insulator film 200 is in contact with the principal surface 101 of the substrate 100. With the example in FIG. 1, the insulator film 200 covers the principal surface 101 of the substrate 100, and the light receiving surface 111 of the photoelectric conversion portion 110. The insulator film 200 has insulation properties equivalent to a degree where the multiple photoelectric conversion portions 110 are not electrically conducted (a lower electrical conductivity than the electrical conductivity of the substrate 100). Typically, the insulator film 200 is transparent. The insulator film 200 may be a single layer film made up of one kind of material, but typically, the insulator film 200 is a multilayer film where multiple layers made up of mutually different materials are layered.

An example of the insulator film 200 in the case of a multilayer film will be described. With the insulator film 200, in order from the principal surface 101 side, a first insulator layer 205, a second insulator layer 206, a third insulator layer 207, a fourth insulator layer 208, a fifth insulator layer 209, a sixth insulator layer 210, a seventh insulator layer 211, an eighth insulator layer 212, a ninth insulator layer 213, a tenth insulator 214, and an eleventh insulator layer 215 are sequentially layered. Also, the insulator film 200 includes a twelfth insulator layer 216 positioned between a part of the second insulator layer 206 and a part of the third insulator layer 207.

Of these insulator layers, the second insulator layer 206, fifth insulator layer 209, seventh insulator layer 211, ninth insulator layer 213, and eleventh insulator layer 215 are made up of silicon oxide ($SiO_2$). The third insulator layer 207 is made up of BPSG (Boron Phosphor Silicate Glass), but may be made up of PSG (Phosphor Silicate Glass) or BSG (Boron Silicate Glass) or silicon oxide ($SiO_2$) instead of BPSG. Of these insulator layers, the first insulator layer 205, fourth insulator layer 208, sixth insulator layer 210, eighth insulator layer 212, tenth insulator layer 214, and twelfth insulator layer 216 are made up of silicon nitride ($Si_3N_4$).

A wiring 217 may be provided to the inner portion of the insulator film 200. The wiring 217 may be a multilayer wiring. FIG. 1 illustrates an example wherein the wiring 217 is made up of a first wiring layer 2171, a second wiring layer 2172, and a plug layer 2173. The plug layer 2173 is positioned between the first wiring layer 2171 and the second wiring layer 2172, and connects the first wiring layer 2171 and second wiring layer 2172. Though an example has been shown wherein the wiring layers are made up of the two layers, three or more wiring layers may be provided by further providing a wiring layer between the first wiring layer 2171 and the second wiring layer 2172. An electroconductive material such as copper, aluminum, tungsten, tantalum, titanium, polysilicon, or the like can be employed as the wiring 217. The typical wiring 217 is opaque, and has metallic luster. A gate electrode 218 of a transfer gate having a MOS configuration is provided onto the principal surface 101 of the semiconductor substrate 100. The gate electrode 218 is made up of polysilicon, and connected to the first wiring layer 2171 via an unshown plug.

An example will be shown regarding the wiring 217. The unshown plug can be formed by the single damascene method with tungsten as the principal component. The first wiring layer 2171 can be formed by the single damascene method with copper as the principal component. The plug layer 2173 and second wiring layer 2172 can integrally be formed by the dual damascene method with copper as the principal component. At this time, the fourth insulator layer 208, sixth insulator layer 210, and eighth insulator 212 can be employed as an etching control layer and a copper nonproliferation layer, and the tenth insulator layer 214 can be used as a copper nonproliferation layer. Note that the first wiring layer 2171, second wiring layer 2172, contact later 2173, and the plug can have barrier metal near the interface with the insulator film 200 with tantalum or the like as the principal component.

The insulator film 200 has an opening portion (hole portion) 201. Though the opening portion 201 can be made up of a through hole or recessed portion, FIG. 1 illustrates the configuration in a case where the opening portion 201 is made up of a recessed portion. The insulator film 200 is substantially flat, and has an upper face 202 in parallel with the principal surface 101 of the substrate 100. Here, the eleventh insulator layer 215 makes up the upper surface 202 of the insulator film 200. An imaginary (geometrical) plane including the upper surface 202 will be referred to as a second plane 1002. The second plane 1002 is in parallel with the first plane 1001, and the first plane 1001 and second plane 1002 are substantially separated by the worth of the thickness of the insulator film 200. The opening portion 201 is continuous with the upper surface 202. In detail, the opening portion 201 is made up of a bottom face 203 and a side face 204. Here, the twelfth insulator layer 216 makes up the bottom face 203. An imaginary (geometrical) plane including the bottom face 203 will be referred to as a third plane 1003. The bottom face 203 is positioned in a region corresponding to the light receiving surface 111. In detail, the bottom face 203 is positioned so as to enter the orthogonal projection from the light receiving surface 111 in a direction in parallel with the principal surface 101 (a direction in parallel with the first plane 1001 and third plane 1003). In this way, the light receiving surface 111 and bottom face 203 are faced via a part of the insulator film 200. The third plane 1003 is in parallel with the second plane 1002 (and first plane 1002), and the second plane 1002 and third plane 1003 are substantially separated by the worth of the depth of the opening portion 201. The side face 204 is continuous with the upper surface 202 and bottom face 203. Accordingly, the side face 204 substantially extends between the second plane 1002 and the third plane 1003. Note that the cross-sectional shape of the opening portion 201 be U-shaped, and the boundary between the bottom face 203 and the side face 204 may not actually be clear. Even in this case, the third plane 1003 includes at least a point closest to the substrate 100 in the surface on the opposite side of the substrate 100 side of the insulator film 200 (the bottom of the opening portion 201). As described above, the face of the insulator film 200 on the opposite side from the substrate 100 side has the upper surface 202, bottom face 203, and side face 204. The surface on the substrate 100 side of the insulator film 200 is the lower face of the insulator film 200. As can be seen from the above description, the distance between the first plane 1001 and the third plane 1003 is substantially equivalent to difference between the thickness of the insulator film 200 and the depth of the opening portion 201.

In one embodiment, the depth of the opening portion 201 is one fourth or more of the thickness of the insulator film 200, and may be half or more of the thickness of the insulator film 200. Also, the depth of the opening portion 201 is longer than the wavelength of incident light. The typical wavelength of incident light is 0.55 μm of green, and distance D is equal to or greater than 0.55 μm. Accordingly, the thickness of the insulator film 200 is thicker than 0.55 μm. The thickness of the insulator film 200 may equal to or greater than 1.0 μm. Upon enormously thickening the insulator film 200, stress increases, or manufacturing takes time, and accordingly, the thickness $T_1$ of the insulator film 200 is substantially equal to or smaller than 1.0 μm, and may equal to or smaller than 5.0 μm.

The plane shape of the side face 204 of the opening portion 201 (the shape of the opening portion 201 within a plane in parallel with the first plane 1001) is a closed-loop shape, and can also have a circular shape, ellipse shape, rounded rectangular shape, rectangular shape, or hexagonal shape. Here, the plane shape of the side face 204 of the opening portion 201 has a circular shape. Note that the bottom face 203 also has a circular shape. The width (diameter) of the opening edge of the opening portion 201 (the side face 204 within the second plane 1002) is typically equal to or smaller than 10 μm, and may equal to or smaller than 5.0 μm. The present invention exhibits a particularly marked advantage in the event that the width of the opening edge is equal to or smaller than 2.0 μm.

The cross-sectional shape of the opening portion 201 (the shape of the opening portion 201 within a plane perpendicular to the first plane 2001, passing through the medial axis) can have an inverted trapezoidal shape, positive trapezoidal shape, rectangular shape, regular square shape, or echelon shape that is a combination of these.

The light path member 220 is positioned within the opening portion 201. In order that light passes through the light path member 220, the light path member 220 is transparent. Note that the transparent mentioned here may have wavelength selectivity as long as sufficient transparency is satisfied as to the light of a wavelength band for substantially performing photoelectric conversion.

Since the light path member 220 is positioned on the inner side of the opening portion 201, the light path member 220 is positioned above the photoelectric conversion portion 110, and is surrounded by the insulator film 200. In detail, the light path member 220 is surrounded by the side face 204 of the opening portion 201, and is in contact with the side face 204 of the insulator film 200. Also, the light path member 220 is also in contact with the bottom face 203 of the opening portion 201. Further, in detail, the light path member 220 is surrounded by the third insulator layer 207, fourth insulator layer 208, fifth insulator layer 209, sixth insulator layer 210, seventh insulator layer 211, eighth insulator layer 212, ninth insulator layer 213, tenth insulator layer 214, and eleventh insulator layer 215 of the insulator film 200. The light path member 220 is then in contact with the twelfth insulator layer 216 making up the bottom face 203 of the opening portion 201. In this way, the light path member 220 is positioned in the region corresponding to the photoelectric conversion portion 110 (the region of the orthogonal projection of the light receiving surface 111). Note that in the event that a through hole is taken as the opening portion 201 instead of a recessed portion, the light receiving surface 111 makes up the bottom face 203 of the opening portion 201. In other words, a light path member 220 is in contact with the photoelectric conversion portion 110. The depth of the opening portion 201 is substantially equal to the thickness of the insulator film 200.

The shape of the light path member 220 generally agrees with the shape of the opening portion 201. With the present embodiment, the light path member 220 has a truncated-cone shape, but may be a truncated-pyramid shape, prism shape, or cylindrical shape according to the shape of the opening portion 201. The light path member 220 has a rotational symmetrical shape as to the medial axis. The width of the light path member 220 (diameter) is typically equal to or smaller than 10 μm, and may equal to or smaller than 5.0 μm. The present invention exhibits a particularly marked advantage in the case that the width of the opening edge is equal to or smaller than 2.0 μm.

The refractive index of at least a part of the light path member 220 is higher than the refractive index of the insulator film 200. Note that, with the following description, the refractive index of the insulator film 200 will be described as the refractive index of a material making up most of the insulator film 200. The refractive index of a part of the light path member 220 may be equal to or lower than the refractive index of the insulator film. With the present invention, in the case of simply mentioning a refractive index, this means an absolute refractive index. Though the refractive indices differ depending on wavelengths, the refractive index mentioned here is a refractive index as to at least the wavelength of light that can generate signal charge at the photoelectric conversion portion 110. Further, in the event that the photoelectric conversion elements 1 have a wavelength selecting portion such as a color filter or the like, the wavelength of light that transmits this wavelength selecting portion is employed. However, for practical purposes, the wavelength of incident light may be regarded as 0.55 μm that is the wavelength of green to which a person's eyes are sensitive, and with the following description, the refractive index will be described as the refractive index as to 0.55 μm.

In the event that the refractive index of the outermost layer of the light path member 220 is higher than the refractive index of the insulator film 200, and the light path member 220 and insulator film 200 make up an interface, total reflection optically geometrically occurs on this interface, which guides incident light into the light path member 220, and consequently can guide into the light receiving surface 111.

Note that a configuration has been familiar as a wave guiding path configuration wherein an opaque film is provided between a light path member and the side face of an insulator film so as to prevent the light path member from coming into contact with the insulator film (e.g., Japanese Patent Laid-Open No. 2002-118245). In the event of providing an opaque film, the amount of light that leaks from the side face 204 that will become a cause for stray light can be reduced. Further, in the event that the opaque film is a film having metallic luster (metal film or the like), metallic reflection occurs at this opaque film, and accordingly, incident light can be guided into the light receiving surface within the light path member. However, when the opaque film is positioned between the light path member 220 and the side face 204, light which has not been input to the light path member 220 but has been input to the insulator film 200 markedly deteriorates in light use efficiency since the light has not been input to the light path member 220. On the other hand, in the event that no opaque film is provided, when the light path member 220 is in contact with the side face 204 of the insulator film 200, light input to the insulator film 200 can be input from the insulator film 200 to the light path member 220, whereby light use efficiency can be improved.

The material (transparent material) of the light path member 220 may be an organic material (resin) or an inorganic material. However, the inorganic materials are desirable since the inorganic materials are chemically stable. Examples of the resins include a siloxane system resin and polyimide or the like. Silicon nitride ($Si_3N_4$), silicon oxynitride ($SiO_xN_y$), and titanium oxide ($TiO_2$) are suitable as the inorganic materials. The light path member 220 may be made up of a single material, or may be made up of multiple materials. The rough values of the refractive indices of the materials exemplified as the materials of the light path member 220 and insulator film 200 will be mentioned. Silicon oxide is 1.4 to 1.5, silicon oxynitride is 1.6 to 1.9, silicon nitride is 1.8 to 2.3, titanium oxide is 2.5 to 2.7, and BSG, PSG, and BPSG are 1.4 to 1.6. Note that the significant figures of the values of the refractive indices mentioned here are two digits, and the second decimal after decimal point is rounded off. The above values are an example, and even with the same materials, a non-stoichiometric composition ratio or material density changes by changing a method for film formation, whereby the refractive index can suitably be set. Note that the refractive index of a common resin is 1.3 to 1.6, and even a high refractive index resin is 1.6 to 1.8, but the effective refractive index can be increased by including a high refractive index inorganic material such as metal oxide or the like in the resin. Examples of the high refractive index inorganic materials to be included in the resin include titanium oxide, tantalum oxide, niobium oxide, tungsten oxide, zirconium oxide, zinc oxide, indium oxide, and oxidization hafnium or the like.

Though the details will be described later with reference to an embodiment, with the present invention, the light path member 220 has a refractive index distribution that is constituted by a first high refractive index region, and a second high refractive index region having a higher refractive index than the refractive index of the first high refractive index region. This refractive index distribution is formed within a portion occupied by the same material (middle portion and peripheral portion) that makes up at least a part of the light path member 220. Practically, the refractive index of the light path member 220 is equal to or greater than 1.6. Also, practically, difference between the maximum value and minimum value of the refractive indices in the refractive index distribution that a portion occupied by the above one material is equal to or greater than 0.025, and may equal to or greater than 0.050. Note that, typically, the difference between the maximum value and minimum value of the refractive indices is equal to or smaller than 0.50, and practically equal to or smaller than 0.25. With the refractive index distribution, the border between the first high refractive index region and the second high refractive index region may clearly be able to be observed, or may not clearly be able to be observed. For example, in the event that the refractive index moderately changes from the center axis to the insulator film 200, the border between the first high refractive index region and the second high refractive index region will not clearly be able to be observed. In such a case, the border between the first high refractive index region and the second high refractive index region can be determined as follows. Specifically, the intermediate value between the maximum value and minimum value of the refractive indices of a portion made up of the same material within the light path member 220 is obtained ((maximum value+minimum value)/2). With the refractive index distribution within the light path member 220, a line connecting a point serving as this intermediate value can be determined as the border between the first high refractive index region and the second high refractive index region. It goes without saying that the first high refractive index region includes a portion of which the refractive index is the minimum, and the second high refractive index region includes a portion of which the refractive index is the maximum.

Note that the same material means materials having the same stoichiometric composition. Accordingly, a material shifted from the stoichiometric composition (i.e., having a different non-stoichiometric composition), and a material of which the crystalline, material density, density of the inclusion (less than main material), material of impurity (equal to or smaller than 1 wt %), and density of the impurity differs can be regarded as the same material. For example, though the stoichiometric composition ratio of silicon nitride is Si:N=3:4, materials of which the actual ratios between Si and N mutually differ within a range where the stoichiometric composition ratios are the same can be regarded as the same material. Also, for example, single crystal silicon and poly-silicon (polycrystalline silicon) are regarded as the same material. Note that materials having a different stoichiometric composition are not the same material. For example, though both of titanium monoxide (TiO) and titanium dioxide ($TiO_2$) are compounds of oxide and titanium (titanium oxide), these materials differ in a stoichiometric manner. As described above, silicon nitride has a considerably higher refractive index than that of silicon oxide, and is also wider in the range of available refractive index as compared to silicon oxynitride, and is accordingly suitable as a material having the above refractive index distribution. In the event of employing silicon nitride as the light path member 220, the above refractive index distribution can be formed by changing the method for film formation of silicon nitride during film formation. Also, in the event of employing a resin where metal oxide particles are dispersed for the light path member 220, the above refractive index distribution can also be formed by changing the density of a high refractive index inorganic material to be included in the resin. Although the refractive index distribution in the light path member 220 can be formed using a different material to each other, the present invention exhibits a particularly marked advantage when the refractive index distribution in the light path member 220 is formed using the same material in the way mentioned above.

The forming method of the light path member 220 and insulator film 200 is not restricted to a particular method. Typically, a first forming method can be employed wherein after forming the insulating film 200 having the opening portion 201 by subjecting an insulator film having no opening portion 201 to etching processing, the material of the light path member 220 is deposited into the opening portion 201, thereby forming the light path member 220. Additionally, a second forming method may be employed wherein a process for providing an opening by subjecting the insulator layers to etching each time each insulator layer making up the insulator film 200 is formed, and a process for depositing the material of the light path member 220 into the opening are repeated. Also, a third forming method may be employed wherein after the light path member 220 is previously disposed, a part of the insulator layers of the insulator film 200 is disposed around the light path member 220. Also, a fourth forming method may be employed wherein after an insulator film having no opening portion 201 is formed, a part of an insulator film corresponding to the light path member 220 is improved, thereby forming the light path member 220.

With the example in FIG. 1, an example is shown wherein the first forming method has been employed. The twelfth insulator layer 216 makes up a part of the insulator film 200, and makes up the bottom face 203 of the opening portion 201. The twelfth insulator layer 216 is disposed on the upper portion of the light receiving surface 111, and on the upper portion of a part of the gate electrode 218. The area of the twelfth insulator layer 216 in the plane direction is larger than the area of the bottom face 203. The area of the twelfth insulator layer 216 in the plane direction is smaller than the areas of the first insulator layer 205 and second insulator layer 206. Here, the bottom face 203 of the opening portion 201 is positioned in a range where the third insulator layer 207 exists. In other words, the third insulator layer 207 is positioned within the third plane 1003. The bottom face of the opening portion 201 (third plane 1003) may be disposed closer to the semiconductor substrate 100 than the first wiring layer 2171.

The twelfth insulator layer 216 can serve as an etching stopper at the time of forming the opening portion 201 in the multilayer insulator film 200. In order to serve the twelfth insulator layer 216 as an etching stopper, a material different from a layer which is in contact with the upper surface of the twelfth insulator layer 216 (here, third insulator layer 207 made up of BPSG) is employed. FIG. 1 illustrates a mode wherein at the time of forming the opening portion 201, as a result of the twelfth insulator layer 216 being subjected to somewhat etching, the bottom face 203 is positioned closer to the photoelectric conversion portion 110 side than the upper surface of the twelfth insulator layer 216. As a result thereof, the twelfth insulator layer 216 makes up a small portion of the side face 204 closer to the bottom face 203. The twelfth insulator layer 216 serving as an etching stopper may not be subjected to etching at all, and in this case, the twelfth insulator layer 216 makes up the bottom face 203 alone.

In the event of providing a layer having a refractive index between the refractive index of the second insulator layer 206 and the refractive index of the photoelectric conversion portion 110 (here, the first insulator layer 205 made up of silicon nitride) between the second insulator layer 206 and the photoelectric conversion portion 110, transmission from the light path member 220 to the photoelectric conversion portion 110 improves.

As described above, at least the light path member 220 and insulator film 200 have a wave guiding path configuration, and light input to the photoelectric conversion element 1 is principally propagated to the photoelectric conversion portion 110 via the light path member 220. A transparent film 319 is provided above the light path member 220 and insulator film 200.

On the opposite side of the light receiving surface 111 side as to the transparent film 319, in order from the transparent film 319 side, a second middle refractive index layer 320, a low refractive index layer 321, a first middle refractive index layer 322, a second lens substrate layer 323, a second lens body layer 324, a second lens body coating layer 325, a flattened film 326, a color filter layer 327, a first lens substrate layer 328, and a first lens body layer 329 are layered. Though the details of these layers will be described later, various modifications may be performed without restricting to this configuration. For example, at least one of the first lens body layer 329 (and first lens substrate layer 328) and the second lens body layer 324 (and second lens substrate layer 323) may be omitted. In the event of omitting the second lens body layer 324 (and second lens substrate layer 323), the flattened film 326 may also be omitted. Also, the color filter layer 327 may be omitted, or the color filter layer 327 may also serve the function of the flattened film 326.

The transparent film 319 controls distance (light path length) from the outermost face of the photoelectric conversion element 1 (here, the surface of the first lens body layer 329) to the insulator film 200 and light path member 220. The typical thickness of the transparent film 319 is equal to or greater than 0.080 µm. On the other hand, upon enormously thickening the transparent film 319, the incident light amount to the light path member 220 decreases. The thickness of the transparent film 319 is equal to or smaller than the depth of the opening portion 201, and also may equal to or smaller than a half of the depth of the opening portion 201. The typical thickness of the transparent film 319 is equal to or smaller than 0.50 µm.

Though the material of the transparent film 319 may differ from the material of the light path member 220, it is desirable for both to have the same material. In the event that the material of the transparent film 319 and the material of the light path member 220 are the same, the light path member 220 and transparent film 319 are integrated, and accordingly, the border between the light path member 220 and the transparent film 319 may not clearly be able to be observed. As described above, the light path member 220 is positioned on the inner side of the opening portion 201 (between the second plane 1002 and the third plane 1003), and the transparent film 319 exists on the outer side of the opening portion 201. Accordingly, the light path member 220 and transparent film 319 can be distinguished by determining whether the transparent material exists on the inner side of the opening portion 201 or on the outer side of the opening portion 201. Partitioning between the inner side and outer side of the opening portion 201 can be performed by extending the upper surface 202 of the insulator film 200 up to above the opening portion 201 in an imaginary manner (the upper edges of the side face 204 are connected by a straight line in an imaginary manner) with an observation image of the cross-section of the photoelectric conversion element 1.

Description that has been made so far is the overview of the photoelectric conversion elements 1. Next, an embodiment of the refractive index distribution that the light path member 220 has will be described with reference to FIGS. 2 through 10. Note that FIGS. 2 and 4 through 9 illustrate only the substrate 100 in FIG. 1, a portion from the first plane 1001 to the second plane 1002, and the transparent film 319. The configuration regarding the portions above the transparent film 319 is common, and also can be changed as appropriate, and accordingly, description thereof will be omitted. Also, with the drawings, a member or portion having the same function is denoted with the same reference numeral, and detailed description thereof will be omitted.

First Embodiment

Figure 2A:
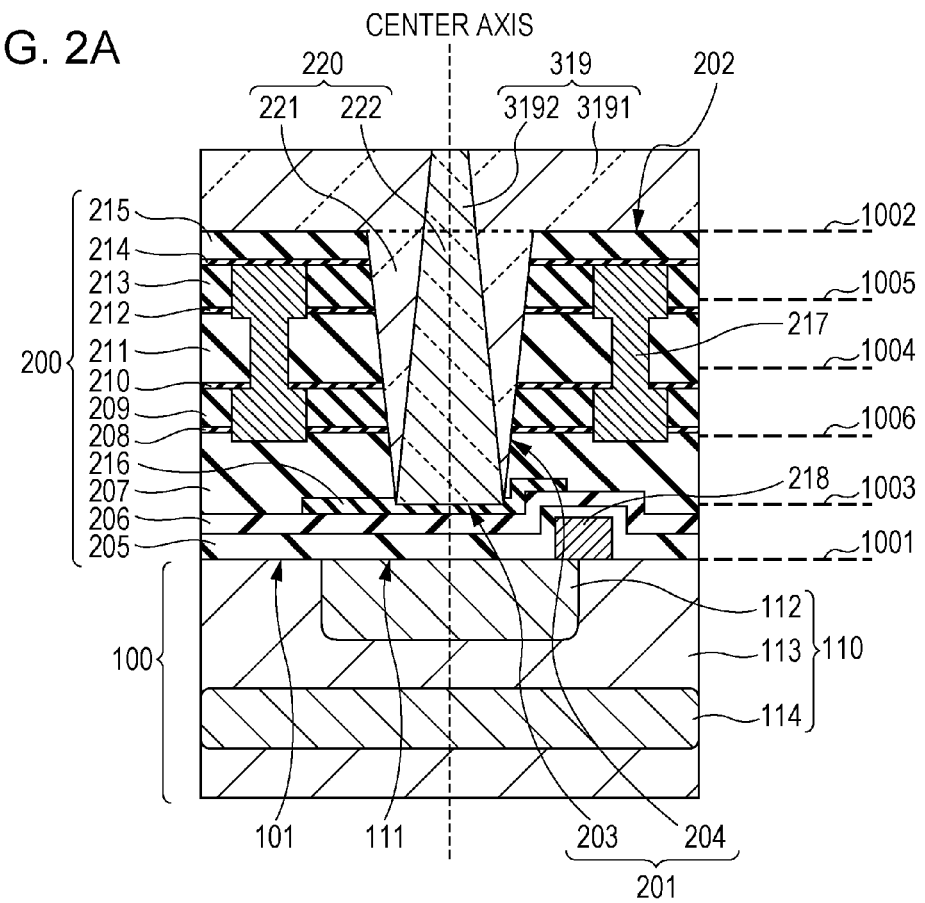
FIG. 2 (including FIG. 2A and FIG. 2B) is a cross-sectional schematic diagram of a part of a photoelectric conversion element for describing an example of a first embodiment.
Figure 2B:
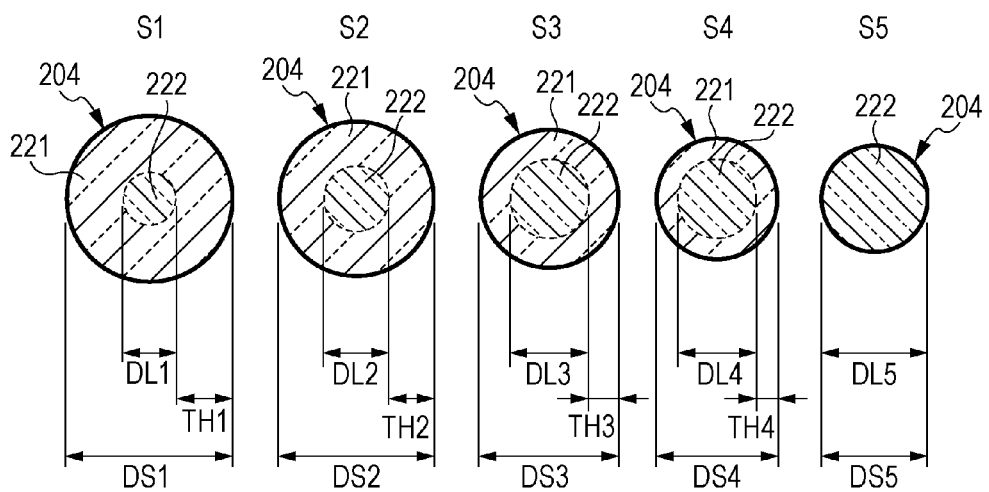

FIG. 2A is a cross-sectional diagram in a direction perpendicular to the principal surface 101 (and light receiving surface 111) of a portion of the photoelectric conversion element 1 according to the first embodiment, and FIG. 2B is a cross-sectional diagram in a direction in parallel with the principal surface 101 (and light receiving surface 111) of a portion of the photoelectric conversion element 1 according to the first embodiment.

FIG. 2A illustrates a fourth plane 1004, a fifth plane 1005, and a sixth plane 1006 in addition to the first plane 1001, second plane 1002, and third plane 1003 described with reference to FIG. 1. The fourth plane 1004 is positioned between the second plane 1002 and the third plane 1003, and is a plane positioned in equal distance from the second plane 1002 and third plane 1003. That is to say, the fourth plane 1004 is positioned in the middle between the second plane 1002 and the third plane 1003. The fifth plane 1005 is positioned between the second plane 1002 and the fourth plane 1004, and the sixth plane 1006 is positioned between the third plane 1003 and the fourth plane 1004. That is to say, the fifth plane 1005 is a plane representing the upper portion of the light path member 220 (a half of input side), and is taken here as a plane positioned in equal distance from the second plane 1002 and fourth plane 1004 for convenience. Similarly, the sixth plane 1006 is a plane representing the lower portion of the light path member 220 (a half of output side), and is taken here as a plane positioned in equal distance from the third plane 1003 and fourth plane 1004 for convenience.

S1 in FIG. 2B illustrates a cross-section in the second plane 1002, S2 illustrates a cross-section in the fifth plane 1005, S3 illustrates a cross-section in the fourth plane 1004, and S4 illustrates a cross-section in the sixth plane 1006. S5 illustrates near the light path member 220 side of the third plane 1003, and specifically illustrates a cross-section in the lower edge of a portion that the third insulator layer 207 of the side face 204 makes up.

The light path member 220 has at least a middle portion 222 and a peripheral portion 221. The peripheral portion 221 is positioned between the middle portion 222 and the insulator film 200.

The peripheral portion 221 surrounds the middle portion 222. The peripheral portion 221 is made up of the same material as with the middle portion 222. There is not a portion made up of a material different from the material of the peripheral portion 221 and middle portion 222 at least between a portion of the peripheral portion 221 and a portion of the middle portion 222, and the same material continues from the middle portion 222 to the peripheral portion 221. Accordingly, it can be said that the peripheral portion 221 is continuous with the middle portion 222. It is desirable that between the entirety of the peripheral portion 221 and the entirety of the middle portion 222, there is not a portion made up of a material different from the materials of both. As with the example shown in FIG. 2, it is desirable that the peripheral portion 221 is in contact with the insulator film 200.

With the present embodiment, the refractive index of the middle portion 222 is higher than the refractive index of the insulator film 200. The refractive index of the peripheral portion 221 is higher than the refractive index of the middle portion 222. Accordingly, the refractive index of the peripheral portion 221 is also higher than the refractive index of the insulator film 200.

In this way, the light path member 220 is made up of a high refractive index material having a higher refractive index than the refractive index of the insulator film 200. The high refractive index material has a refractive index distribution so as to be configured of a first high refractive index region, and a second high refractive index region having a higher refractive index than the refractive index of the first high refractive index region. With the present embodiment, the middle portion 222 is the first high refractive index region, and the peripheral portion 221 is the second high refractive index region. FIG. 2A illustrates a scene where the refractive indices markedly differ between the middle portion 222 and the peripheral portion 221. For example, in the event that the refractive index of the middle portion 222 is 1.83, and the refractive index of the peripheral portion 221 is 1.90, with a cross-sectional observation image of the light path member 220 in a direction perpendicular to the principal surface 101 observed by an electron microscope, it can be recognized that the image has contrast between the middle portion 222 and the peripheral portion 221.

In order to form a refractive index distribution using silicon nitride, the following methods can be employed, for example. As for a first method, first, a first silicon nitride film is formed on the side face 204 by relatively increasing the amount of silicon components as to nitride components of the film formation material. Thereafter, a second silicon nitride film is formed above the first silicon nitride film by reducing the amount of silicon components as to nitride components of the film formation material as compared to when forming the first silicon nitride. At this time, one of the amount of nitride components, and the amount of silicon components may be the same, or both may differ at the time of forming the first silicon nitride film and at the time of forming the second silicon nitride film. According to this first method, the light path member 220 can be formed wherein the first silicon nitride film makes up the peripheral portion 221, and the second silicon nitride film makes up the middle portion 222. This is because even if the stoichiometric composition ratio is Si:N=3:4, with regard to a non-stoichiometric composition, silicon nitride of which the ratio of silicon as to nitride (Si/N) is relatively high has a higher refractive index than that of silicon nitride of which the ratio of silicon as to nitride (Si/N) is relatively low. With respect to silicon nitride formed with a common film formation such as a CVD method, the ratio of silicon as to nitride is 1/2 to 3/2, and typically is 3/5 to 1. Note that, a refractive index of silicon nitride of which ratio of silicon as to nitride is 3/4, in other words a refractive index of silicon nitride of silicon nitride of which actual composition agree to stoichiometric composition, may be 2.0.

As for a second method, first, a first silicon nitride film of which the adhesiveness and material density are high is formed above the side face 204 by reducing the input energy of the film formation material. Thereafter, a second silicon nitride film of which the embedment is high and the material density is low is formed above the first silicon nitride film by increasing the input energy of the film formation material. Thus, the light path member 220 can be formed wherein the first silicon nitride film makes up the peripheral portion 221, and the second silicon nitride film makes up the middle portion 222. This is because a dense silicon nitride film where the density of silicon nitride is relatively high has a higher refractive index than a coarse nitride film where the density of silicon nitride is relatively low.

The closer to the light receiving surface 111 the peripheral portion 221 is, the thinner the thickness of the peripheral portion 221 becomes. The details will be described with reference to FIG. 2B. DS1, DS2, DS3, DS4, and DS5 represent the width (diameter) of the opening portion 201 in the cross-sections S1 through S5. With the present embodiment, the side face 204 shown in FIG. 1 has a forward tapered shape as to the light receiving surface 111, and has relationship of DS1>DS2>DS3>DS4>DS5.

DL1, DL2, DL3, DL4, and DL5 represent the width (diameter) of the middle portion 222 in the cross-sections S1 through S5. The center axis passes through the middle portion 222, and the middle portion 222 continuously extends along the center axis without interruption. With the present embodiment, the middle portion 222 has a truncated-cone shape, and the outer face of the middle portion 222 (the face on the peripheral portion 221 side) has a forward tapered shape as to the light receiving surface 111. The outer face of the middle portion 222 is concentric with the center axis and is rotationally symmetrical as to the central axis, and has relationship of DL1<DL2<DL3<DL4<DL5. Note that DL5 is a smaller value than DS5, but is a value extremely close to DS5.

TH1, TH2, TH3, and TH4 represent the thickness (width) of the peripheral portion 221 in the cross-sections S1 through S4. With the present embodiment, the inner face of the peripheral portion 221 (the face on the middle portion 222 side) and the outer face of the peripheral portion 221 (the face on the insulator film 200 side) have a reverse tapered shape as to the light receiving surface 111. Relation of TH1>TH2>TH3>TH4>TH5 holds. Here, TH5 (not shown) represents the thickness of the peripheral portion 221 in the cross-section S5, and is a value equivalent to (DS5−DL5)/2, and is a value extremely close to 0. In this way, the peripheral portion 221 continuously extends along the side face 204 of the insulator film 200 without interruption.

Here, though the ratio (TH1/TH5) between the maximum value (TH1) and the minimum value (TH5) of the thickness of the peripheral portion 221 is almost infinite, the minimum value of the thickness of the peripheral portion 221 is equal to or smaller than a half of the maximum value (maximum value/minimum value 2). When assuming that the wavelength of light to be input to the light path member 220 is $\lambda$, and the refractive index of the insulator film 200 is $n_0$, and the refractive index of the peripheral portion 221 is $n_1$, the maximum value of the thickness of the peripheral portion 221 is greater than $\lambda/2 \sqrt{(n_1^2 - n_0^2)}$. Also, the minimum value of the thickness of the peripheral portion 221 is smaller than $\lambda/4 \sqrt{(n_1^2 - n_0^2)}$. The thickness of the peripheral portion 221 has the maximum value at the upper portion of the light path member 220 (from the second plane 1002 to the fourth plane 1004). Also, the thickness of the peripheral portion 221 has the minimum value at the lower portion of the light path member 220 (from the fourth plane 1004 to the third plane 1003).

Even with a portion of the thickness of the peripheral portion 221 between the minimum value and the maximum value, the thickness in a plane closer to the light receiving surface 111 is equal to or smaller than ½. With the example shown in FIGS. 2A and 2B, the thickness of the peripheral portion 221 in the fourth plane 1004 (TH3) is ½ of the thickness of the peripheral portion 221 in the second plane 1002 (TH1). Also, the thickness of the peripheral portion 221 in the sixth plane 1006 (TH4) is smaller than ½ of the thickness of the peripheral portion 221 in the fifth plane 1005 (TH2).

Figure 3A:
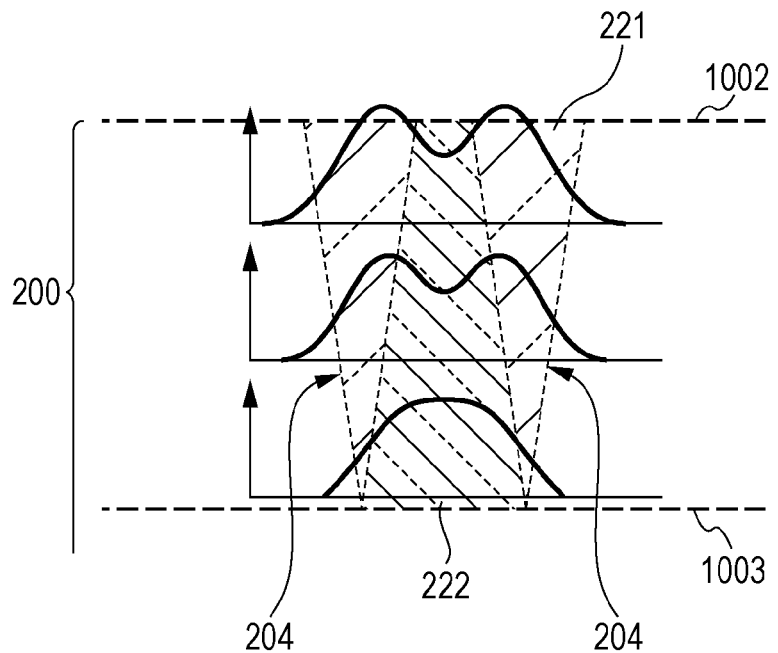
FIG. 3 (including FIG. 3A and FIG. 3B) is a schematic diagram for describing the first embodiment.

FIG. 3A illustrates, with the present embodiment, field strength distributions at the time of light in parallel with the center axis of the light path member 220 being input to the light path member 220. In detail, three field strength distributions are distributions within a plane in parallel with the light receiving surface 111 of the field strengths in three positions that differ in height within the light path member 220. A position on the lateral axis indicates a height within the light path member 220.

It can wave-optically be conceived that light is apt to concentrate on a region having a high refractive index. Therefore, the field strength of the peripheral portion 221 is higher than the field strength of the middle portion 222 at a position where the thickness of the peripheral portion 221 having a higher refractive index than that of the middle portion 222 is great. Also, light scarcely leaks from the light path member 220 to the insulator film 200 having a lower refractive index than that of the peripheral portion 221. Therefore, it is thought that the loss of light is suppressed.

With the present embodiment, the thickness of the peripheral portion 221 is gradually reduced as the peripheral portion 221 comes closer to the photoelectric conversion portion 110. Therefore, light of which the amount is the same level as with a position where the thickness is great is prevented from propagating through the peripheral portion 221 at a portion where the thickness of the peripheral portion 221 is small. Accordingly, light prevented from propagating through the peripheral portion 221 makes the transition to the middle portion 222. With the present embodiment, the same material continues through the peripheral portion 221 and middle portion 222, and accordingly, the loss of light in this transition is suppressed. In general, it can be conceived that the refractive index changes at the interface between different materials in a discontinuous manner. On the other hand, the peripheral portion 221 and middle portion 222 are made up of the same material, and accordingly, the refractive index continuously changes at the border between the peripheral portion 221 and middle portion 222.

With the light emitted from the wider middle portion 222, diffraction is prevented from occurring between the light path member 220 and the photoelectric conversion portion 110 as compared to a case where light is emitted from the narrower peripheral portion 221. Therefore, it is conceived that loss due to that the light emitted from the light path member 220 is diffracted and prevented from being input to the photoelectric conversion portion 110, is suppressed.

As described above, with the present embodiment, it can be conceived that light propagates while suppressing loss of light between the light path member 220 and the insulator film 200, within the light path member 220, and between the light path member 220 and the photoelectric conversion portion 110, and accordingly, sensitivity improves.

As shown in the present embodiment, it is desirable that the thickness of the peripheral portion 221 is continuously reduced as the peripheral portion 221 comes closer to the light receiving surface 111. That is to say, it is desirable that the thickness of the peripheral portion 221 is monotonously reduced in the narrow sense as to reduction in distance to the light receiving surface 111. The thickness of the peripheral portion 221 is intermittently reduced as the peripheral portion 221 comes closer to the light receiving surface 111. That is to say, the thickness of the peripheral portion 221 may be monotonously reduced in the broad sense as to reduction in distance to the light receiving surface 111. However, it can be conceived that upon the thickness of the peripheral portion 221 being intermittently reduced, the above transition to the middle portion 222 is relatively small at a portion where the thickness of the peripheral portion 221 is constant. Therefore, it can be conceived that upon the thickness of the peripheral portion 221 being suddenly reduced, occurrence of transition to the insulator film 200 is facilitated in addition to the transition to the middle portion 222, and accordingly, loss occurs.

Figure 3B:
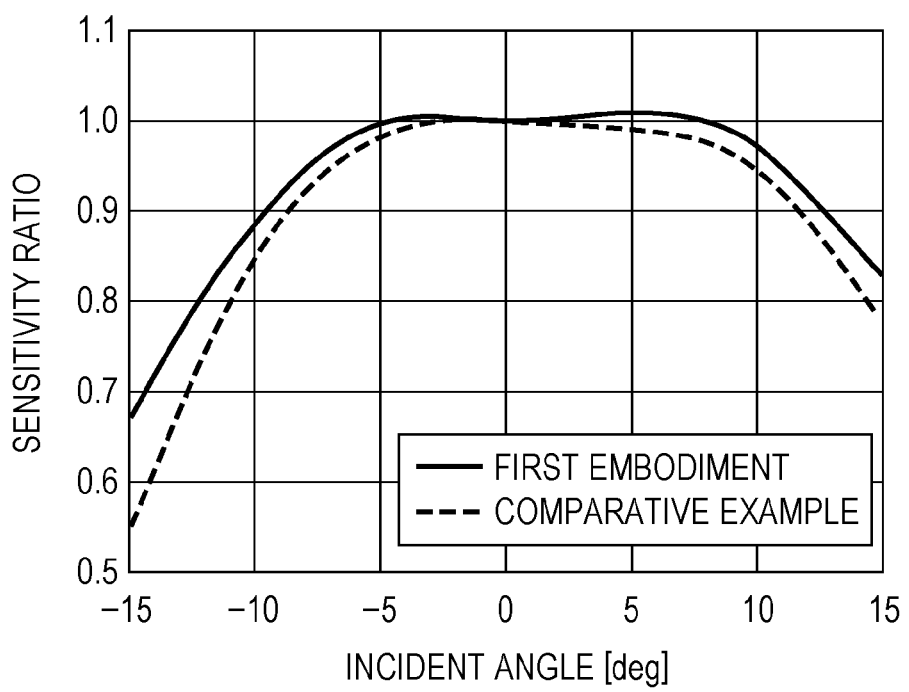

FIG. 3B illustrates, with the present embodiment, sensitivity at the time of changing the incident angle as to the center axis of the light path member 220. Note that it is a mode as a comparative example wherein the light path member 220 does not have a refractive index distribution. As can be understood from FIG. 3B, according to the present embodiment, sensitivity as to oblique incident light improves. As a result thereof, F value linearity can be improved. Note that, with light to be input in parallel with the center axis of the photoelectric conversion element 1, a focal point is formed in the inner portion of the light path member 200, and a focal point may also be formed between the second plane 1002 and the fourth plane 1004. Typically, with light to be input in parallel with the center axis of the photoelectric conversion element 1, a focal point is formed within the middle portion 222. On the other hand, with light to be obliquely input to the center axis of the photoelectric conversion element 1, a focal point is principally formed within the peripheral portion 223.

In the event that the insulator film 200 is a multilayer film, the refractive index of a part of layers of the multilayer film may be equal to or greater than the refractive index of the middle portion 222 of the light path member 220, and may further be equal to or greater than the refractive index of the peripheral portion 221. Such a layer which has a refractive index equal to or greater than the refractive index of the first high refractive index region will be referred to as a high refractive index insulator layer. On the other hand, the remaining layer of the multilayer film having a lower refractive index than the refractive index of the middle portion 222 of the light path member 220, in other words, having a refractive index smaller than the refractive index of the first high refractive index region, will be referred to as a low refractive index insulator layer.

In the case of the present embodiment, on the one hand, of the insulator film 200, the third insulator layer 207, fifth insulator layer 209, seventh insulator layer 211, ninth insulator layer 213 and eleventh insulator layer 215, which are made up of silicon oxide or silicate glass and make up the side face 204 of the opening portion 201, are low refractive index insulator layers. The low refractive index insulator layers surround the light path member 220. For example, in the event that the refractive index of the middle portion 222 is 1.83, and the refractive index of the peripheral portion 221 is 1.90, when the refractive indices of the third insulator layer 207, fifth insulator layer 209, seventh insulator layer 211, ninth insulator layer 213 and eleventh insulator layer 215, are 1.46, these insulator layers are low refractive index insulator layers. Note that the second insulator layer 206 is also a low refractive index insulator layer, but does not make up the side face 204 of the opening portion 201. Though the side face 204 in the cross-sections S1 through S5 is shown in FIG. 2B, in detail, the side face 204 in each the cross-sections are respectively formed by different insulator layers as can be understood from FIG. 2A. Specifically, the side face 204 in the cross-sections S1 is formed by the eleventh insulator layer 215, the side face 204 in the cross-sections S2 is formed by the ninth insulator layer 213, the side face 204 in the cross-sections S3 is formed by the seventh insulator layer 211, and the side face 204 in the cross-sections S4 and S5 are formed by the third insulator layer 207. On the other hand, since the peripheral portion 221 and middle portion 222 are silicon nitride, and accordingly, of the insulator film 200, the fourth insulator layer 208, sixth insulator layer 210, eighth insulator layer 212, and tenth insulator layer 214, which are made up of silicon nitride and make up the side face 204 of the opening portion 201, are high refractive index insulator layers. These high refractive index insulator layers surround the light path member 220. For example, in the event that the refractive index of the middle portion 222 is 1.83, and the refractive index of the peripheral portion 221 is 1.90, when the refractive indices of the fourth insulator layer 208, sixth insulator layer 210, eighth insulator layer 212, and tenth insulator layer 214 are 2.03, these insulator layers are high refractive index insulator layers. Note that the first insulator layer 205 is also a high refractive index insulator layer, but does not make up the side face 204 of the opening portion 201. Thus, with the present example, the high refractive index insulator layer is made up of the same material as with the peripheral portion 221 and middle portion 222, and the low refractive index insulator layer is made up of a material different from the materials of the peripheral portion 221 and middle portion 222.

However, it is not desirable that a layer having a refractive index equal to or greater than the refractive index of such a light path member 220 (high refractive index insulator layer) makes up most of the side face 204 of the opening portion 201. This is because there is a probability that light input to the light path member 220 will propagate within a high refractive index insulator layer, and leak from the opening portion 201. Therefore, the side face 204 of the opening portion 201 that a high refractive index insulator layer makes up is smaller than a half of the area of the entire side face 204 of the opening portion 201, and may be smaller than ¼. In other words, of the multilayer film, a layer having a refractive index lower than the refractive index of the light path member 220 (low refractive index insulator layer) is equal to or greater than a half of the area of the entire side face 204 of the opening portion 201, and equal to or greater than ¾. The area of the side face 204 that each layer makes up can be adjusted by suitably setting the thickness of each layer, or the angle of the side face 204. The thickness of one low refractive index insulator layer is typically equal to or greater than 0.10 μm and also equal to or smaller than 0.60 μm. When assuming that the wavelength of light to be input to the light path member 220 is λ, and the refractive index of a low refractive index insulator layer is $n_{OH}$, the thickness of one low refractive index insulator layer may be equal to or smaller than $\lambda/2n_{OH}$, and may be equal to or smaller than $\lambda/4n_{OH}$. The thickness of a high refractive index insulator layer is typically equal to or greater than 0.010 μm and also equal to or smaller than 0.10 μm.

Second Embodiment

Figure 4A:
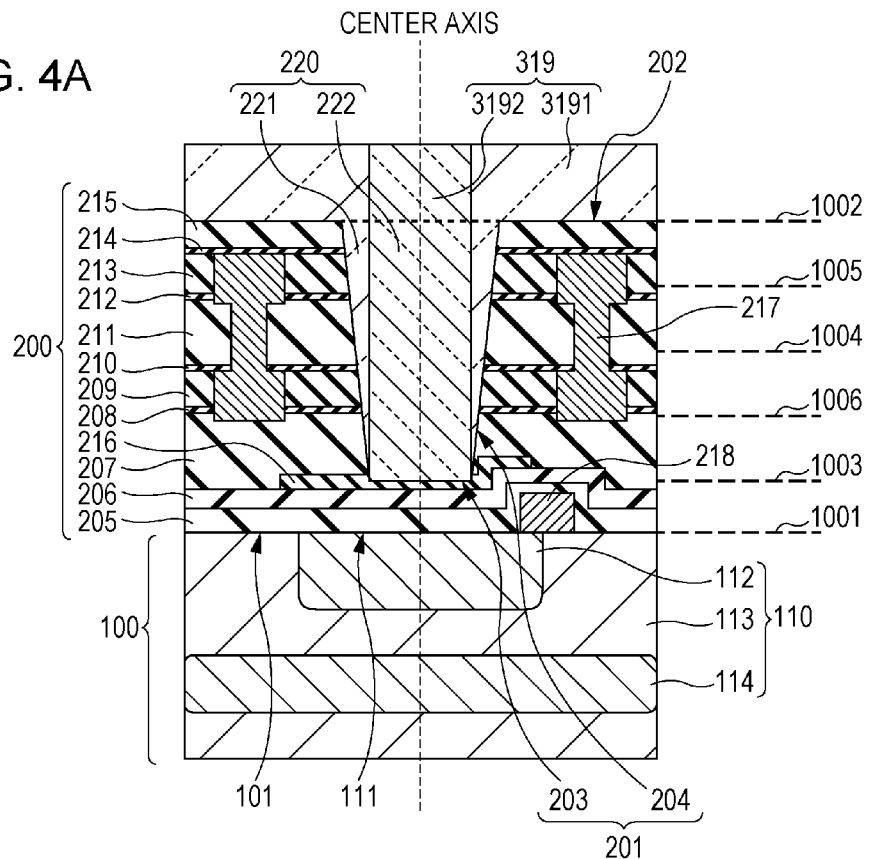
FIG. 4 (including FIG. 4A and FIG. 4B) is a cross-sectional schematic diagram of a part of a photoelectric conversion element for describing an example of a second embodiment.
Figure 4B:
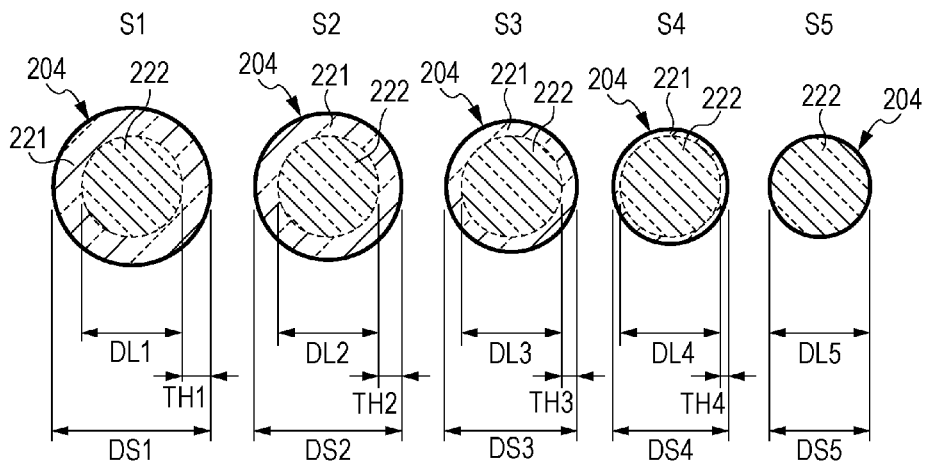

FIG. 4A is a cross-sectional diagram in a direction perpendicular to the principal surface 101 (and light receiving surface 111) of a part of the photoelectric conversion elements 1 according to the second embodiment, and FIG. 4B is a cross-sectional diagram in a direction parallel with the principal surface 101 (and light receiving surface 111) of a part of the photoelectric conversion elements 1 according to the second embodiment.

With the present embodiment as well, the middle portion 222 is the first high refractive index region, and the peripheral portion 221 is the second high refractive index region having a higher refractive index than that of the first high refractive index region (middle portion 222).

The definitions of the first plane 1001, second plane 1002, third plane 1003, fourth plane 1004, fifth plane 1005, sixth plane 1006, S1 through S5, DS1 through DS5, DL1 through DL5, and TH1 through TH5 are the same as with FIGS. 2A and 2B, and accordingly, description thereof will be omitted.

With the present embodiment as well, in the same way as with the first embodiment, the side face 204 has a forward tapered shape. On the other hand, the middle portion 222 has a cylindrical shape, and the outer face of the middle portion 222 (the face on the peripheral portion 221 side) is perpendicular to the light receiving surface 111. Relationship of DL1=DL2=DL3=DL4=DL5 holds. Also, though the inner face of the peripheral portion 221 (the face on the middle portion 222 side) is perpendicular to the light receiving surface 111, the outer face of the peripheral portion 221 (the face on the insulator film 200 side) has a reverse papered shape as to the light receiving surface 111. Relationship of TH1>TH2>TH3>TH4>TH5 holds.

A modification (not shown) of the present embodiment will be described. The side face 204 of the insulator film 200 may not have a tapered shape, and may be perpendicular to the light receiving surface 111 (DS1=DS2=DS3=DS4=DS5). In this case, the outer face of the middle portion 222 should have a forward tapered shape as to the light receiving surface 111 (DL1<DL2<DL3<DL4<DL5). Also, the side face 204 of the insulator film 200 may have a reverse tapered shape, and DS1<DS2<DS3<DS4<DS5 may hold. In this case, the outer face of the middle portion 222 should have a forward tapered shape having a smaller inclination than that of the side face 204, as to the light receiving surface 111. That is to say, DS1−DL1>DS2−DL2>DS3−DL3>DS4−DL4>DS5−DL5 holds, whereby relationship of TH1>TH2>TH3>TH4>TH5 can be realized.

Third Embodiment

Figure 5A:
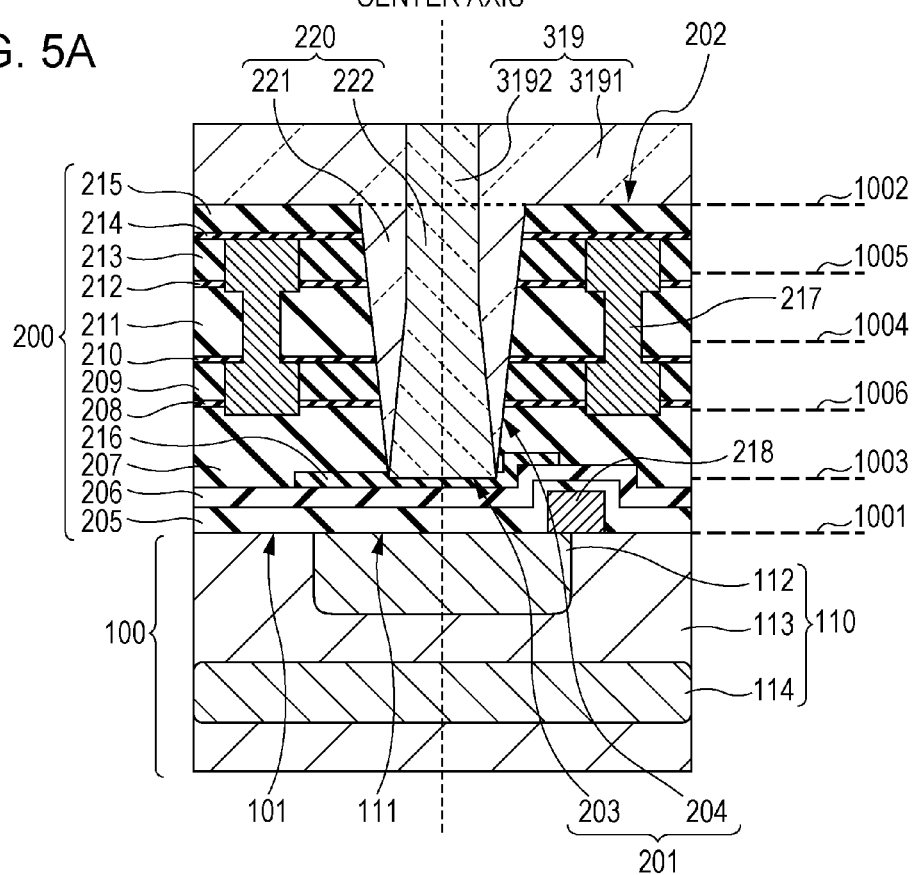
FIG. 5 (including FIG. 5A and FIG. 5B) is a cross-sectional schematic diagram of a part of a photoelectric conversion element for describing an example of a third embodiment.
Figure 5B:
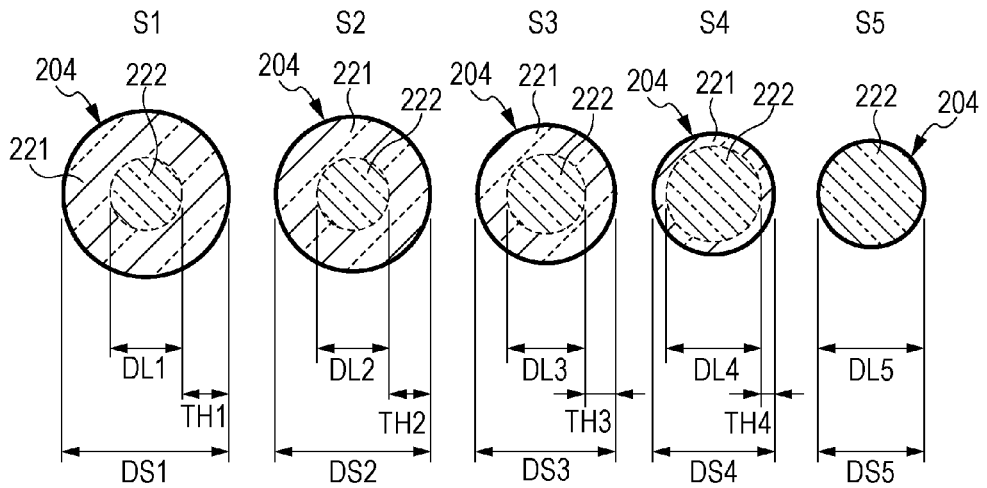

FIG. 5A is a cross-sectional diagram in a direction perpendicular to the principal surface 101 (and light receiving surface 111) of a part of the photoelectric conversion elements 1 according to the third embodiment, and FIG. 5B is a cross-sectional diagram in a direction parallel with the principal surface 101 (and light receiving surface 111) of a part of the photoelectric conversion elements 1 according to the third embodiment.

With the present embodiment as well, the middle portion 222 is the first high refractive index region, and the peripheral portion 221 is the second high refractive index region having a higher refractive index than that of the first high refractive index region (middle portion 222).

The definitions of the first plane 1001, second plane 1002, third plane 1003, fourth plane 1004, fifth plane 1005, sixth plane 1006, S1 through S5, DS1 through DS5, DL1 through DL5, and TH1 through TH5 are the same as with FIGS. 2A and 2B, and accordingly, description thereof will be omitted.

With the present embodiment as well, in the same way as with the first embodiment, the side face 204 has a forward tapered shape. On the other hand, a portion of the upper portion of the middle portion 222 (a portion from the second plane 1002 to the fifth plane 1005) has a cylindrical shape. The remaining portion of the upper portion of the middle portion 222 (a portion from the fifth plane 1005 to the fourth plane 1004) and the lower portion of the middle portion 222 have a regular truncated-cone shape. Relationship of DL1=DL2<DL3<DL4<DL5 holds. Also, the outer face of the peripheral portion 221 (the face on the insulator film 200 side) has a reverse tapered shape as to the light receiving surface 111. Relationship of TH1>TH2>TH3>TH4>TH5 holds.

Fourth Embodiment

Figure 6A:
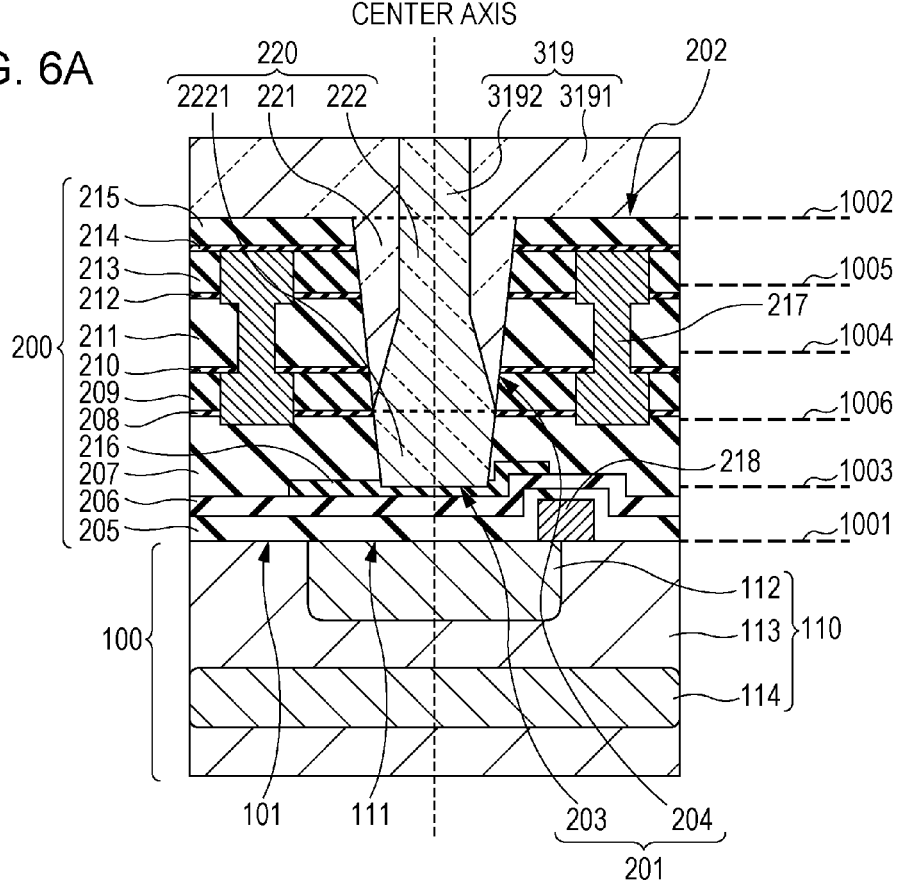
FIG. 6 (including FIG. 6A and FIG. 6B) is a cross-sectional schematic diagram of a part of a photoelectric conversion element for describing an example of a fourth embodiment.
Figure 6B:
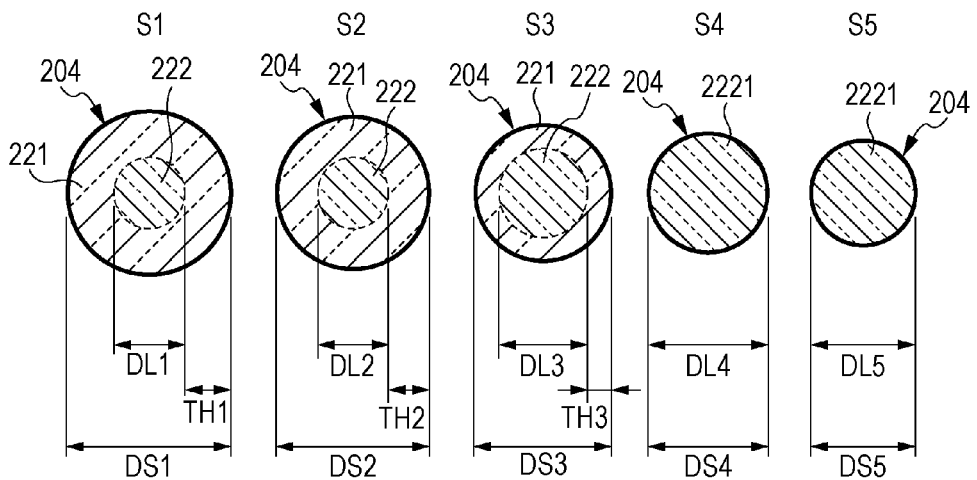

FIG. 6A is a cross-sectional diagram in a direction perpendicular to the principal surface 101 (and light receiving surface 111) of a part of the photoelectric conversion elements 1 according to the fourth embodiment, and FIG. 6B is a cross-sectional diagram in a direction parallel with the principal surface 101 (and light receiving surface 111) of a part of the photoelectric conversion elements 1 according to the fourth embodiment.

With the present embodiment as well, the middle portion 222 is the first high refractive index region, and the peripheral portion 221 is the second high refractive index region having a higher refractive index than that of the first high refractive index region (middle portion 222).

The definitions of the first plane 1001, second plane 1002, third plane 1003, fourth plane 1004, fifth plane 1005, sixth plane 1006, S1 through S5, DS1 through DS5, DL1 through DL3, and TH1 through TH3 are the same as with FIGS. 2A and 2B, and accordingly, description thereof will be omitted.

With the present embodiment as well, in the same way as with the first embodiment, the side face 204 has a forward tapered shape, and relationship of DS1>DS2>DS3>DS4>DS5 holds. On the other hand, the present embodiment differs from the first through third embodiments in that the peripheral portion 221 and middle portion 222 are positioned between the second plane 1002 and the sixth plane 1006, and not positioned between the sixth plane 1006 and the third plane 1003. With the present embodiment, the light path member 220 has an emission portion 2221 having a lower refractive index than that of the peripheral portion 221. The refractive index of the emission portion 2221 is higher than the refractive index of the insulator film 200, and is typically the same refractive index of the middle portion 222. Accordingly, with the present embodiment, the middle portion 222 and emission portion 2221 make up the first high refractive index region, and the peripheral portion 221 is the second high refractive index region having a higher refractive index than that of the first high refractive index region (middle portion 222).

The emission portion 2221 is positioned between the third plane 1003 and the sixth plane 1006. That is to say, the emission portion 2221 is positioned between the middle portion 222 and the photoelectric conversion portion 110, and for details positioned between the bottom face 203 shown in FIG. 1 and the middle portion 222. The emission portion 2221 is made up of the same material as with the middle portion 222 (and peripheral portion 221), and is continuous with the middle portion 222. DL4 and DL5 shown in FIG. 6B represent the width (diameter) of the emission portion 2221. The emission portion 2221 has a reverse truncated-cone shape.

With the present embodiment as well, in the same way as with the third embodiment, a portion of the upper portion of the middle portion 222 (a portion from the second plane 1002 to the fifth plane 1005) has a cylindrical shape. Also, a remaining portion of the upper portion of the middle portion 222, and a portion of the lower portion of the middle portion 222 (a portion from the fourth plane 1004 to the sixth plane 1006) have a regular truncated-cone shape.

A remaining portion of the upper portion of the middle portion 222 (a portion from the fifth plane 1005 to the fourth plane 1004), and the lower portion of the middle portion 222 (a portion from the fourth plane 1004 to the sixth plane 1006) have a regular truncated-cone shape. Relationship of DL1=DL2<DL3<DL4<DL5 holds. Note that the emission portion 2221 is in contact with the insulator film 200, and relations of DL4=DS4 and DL5=DS5 hold. Relationship of TH1>TH2>TH3>TH4 holds.

Fifth Embodiment

Figure 7A:
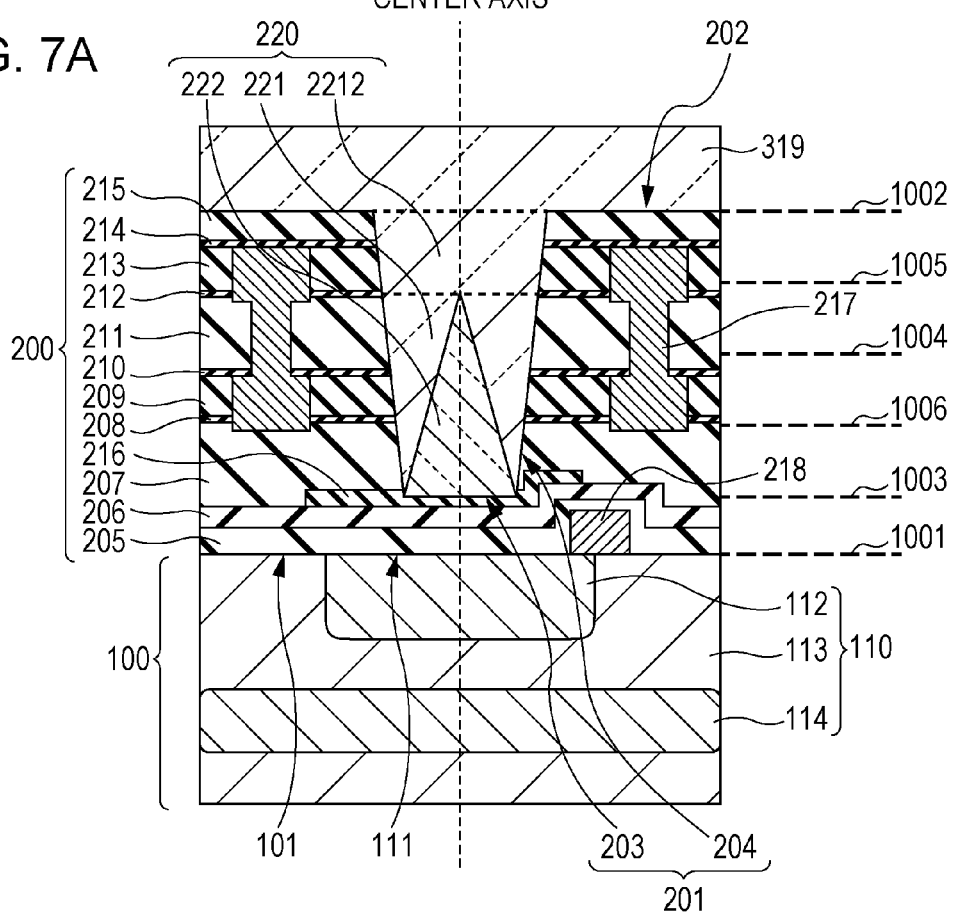
FIG. 7 (including FIG. 7A and FIG. 7B) is a cross-sectional schematic diagram of a part of a photoelectric conversion element for describing an example of a fifth embodiment.
Figure 7B:
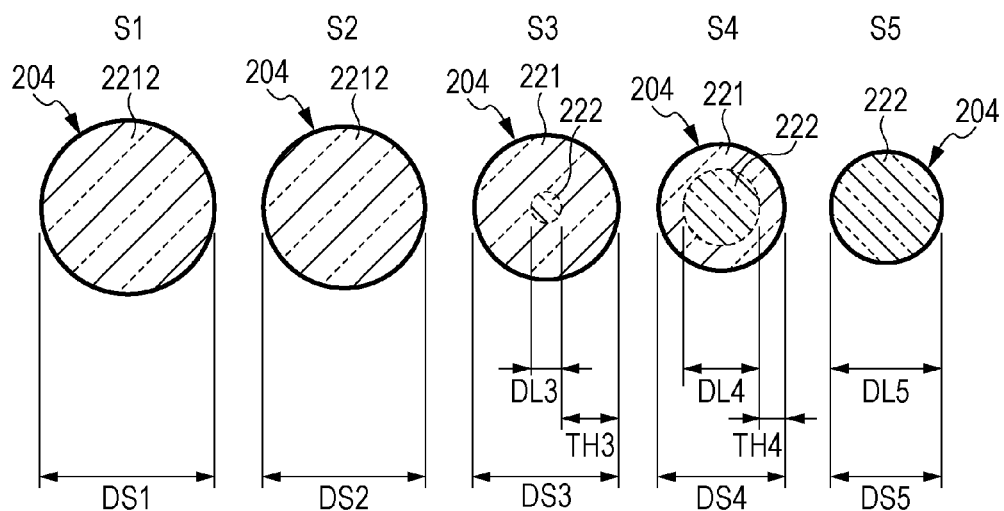

FIG. 7A is a cross-sectional diagram in a direction perpendicular to the principal surface 101 (and light receiving surface 111) of a part of the photoelectric conversion elements 1 according to the fifth embodiment, and FIG. 7B is a cross-sectional diagram in a direction parallel with the principal surface 101 (and light receiving surface 111) of a part of the photoelectric conversion elements 1 according to the fifth embodiment.

With the present embodiment as well, the middle portion 222 is the first high refractive index region, and the peripheral portion 221 is the second high refractive index region having a higher refractive index than that of the first high refractive index region (middle portion 222).

The definitions of the first plane 1001, second plane 1002, third plane 1003, fourth plane 1004, fifth plane 1005, sixth plane 1006, S1 through S5, DS1 through DS5, DL3 through DL5, and TH3 through TH5 are the same as with FIGS. 2A and 2B, and accordingly, description thereof will be omitted.

With the present embodiment as well, in the same way as with the first embodiment, the side face 204 has a forward tapered shape, and relationship of DS1>DS2>DS3>DS4>DS5 holds. On the other hand, the present embodiment differs from the first through fifth embodiments in that the peripheral portion 221 and middle portion 222 are positioned between the fifth plane 1005 and the third plane 1003, and not positioned between the second plane 1002 and the fifth plane 1005.

With the present embodiment, the light path member 220 has an incidence portion 2212 having a higher refractive index than that of the middle portion 222. The refractive index of the incidence portion 2212 is higher than the refractive index of the insulator film 200, and is typically the same refractive index of the peripheral portion 221. Accordingly, with the present embodiment, the middle portion 222 is the first high refractive index region, and the peripheral portion 221 and incidence portion 2212 make up the second high refractive index region having a higher refractive index than that of the first high refractive index region (middle portion 222).

The incidence portion 2212 is positioned between the second plane 1002 and the fifth plane 1005. That is to say, the incidence portion 2212 is positioned between the transparent film 319 and the peripheral portion 221. The incidence portion 2212 is made up of the same material as with the peripheral portion 221 (and middle portion 222), and is continuous with the peripheral portion 221. DL1 and DL2 shown in FIG. 7B represent the width (diameter) of the incidence portion 2212. The incidence portion 2212 has a reverse truncated-cone shape.

With the present embodiment, the middle portion 222 has a cone shape, but may be a truncated-cone shape. Relationship of DL3<DL4<DL5 holds. Note that the incidence portion 2212 is in contact with the insulator film 200, and relations of DL4=DS4 and DL5=DS5 hold. Relationship of TH1>TH2>TH3>TH4 holds. The middle portion 222 having such a cone shape or truncated-cone shape may be formed by applying the manufacturing method of a spindt-type electron-emitting device (e.g., rotary shadowing).

Sixth Embodiment

Figure 8A:
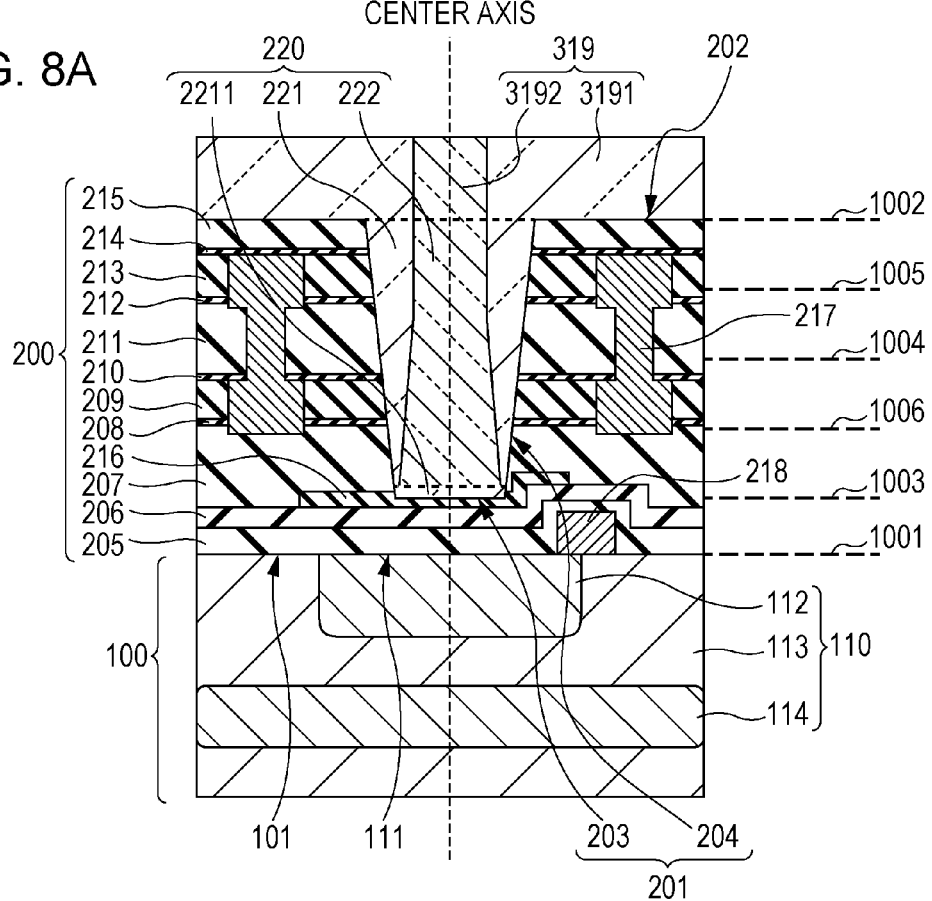
FIG. 8 (including FIG. 8A and FIG. 8B) is a cross-sectional schematic diagram of a part of a photoelectric conversion element for describing an example of a sixth embodiment.
Figure 8B:
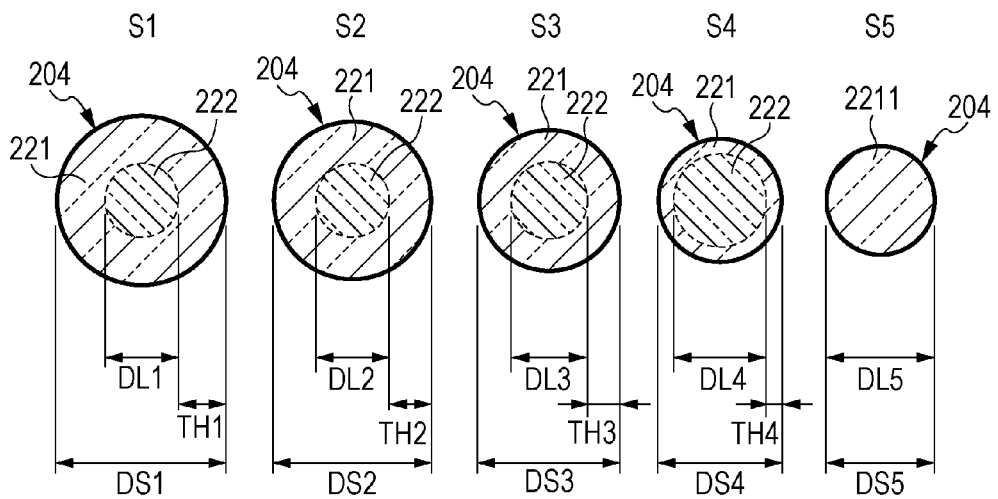

FIG. 8A is a cross-sectional diagram in a direction perpendicular to the principal surface 101 (and light receiving surface 111) of a part of the photoelectric conversion elements 1 according to the sixth embodiment, and FIG. 8B is a cross-sectional diagram in a direction parallel with the principal surface 101 (and light receiving surface 111) of a part of the photoelectric conversion elements 1 according to the sixth embodiment. With the present embodiment as well, the middle portion 222 is the first high refractive index region, and the peripheral portion 221 is the second high refractive index region having a higher refractive index than that of the first high refractive index region (middle portion 222).

The definitions of the first plane 1001, second plane 1002, third plane 1003, fourth plane, 1004 fifth plane 1005, sixth plane 1006, S1 through S5, DS1 through DS5, DL1 through DL4, and TH1 through TH4 are the same as with FIGS. 2A and 2B, and accordingly, description thereof will be omitted.

With the present embodiment, the light path member 220 has an emission portion 2211. The emission portion 2211 is continuous with the peripheral portion 221, and is made up of the same material as with the peripheral portion 221. The refractive index of the emission portion 2211 is higher than the refractive index of the middle portion 222. The thickness of the emission portion 2211 is thin. With the present embodiment, the middle portion 222 is the first high refractive index region, and the peripheral portion 221 and emission portion 2211 make up the second high refractive index region having a higher refractive index than that of the first high refractive index region (middle portion 222). TH5 in FIG. 8B represents the width (diameter) of the emission portion 2211, and here TH5=DS5 holds.

With the first through sixth embodiments described above, a mode has been described wherein the peripheral portion 221 is in contact with the side face 204 of the insulator film 200. However, one or more layers making up a part of the light path member 220 may lie between the peripheral portion 221 and the side face 204 of the insulator film 200 with the peripheral portion 221 being not in contact with the side face 204 of the insulator film 200.

For example, the light path member 220 may have a low refractive index layer (not shown) having a refractive index smaller than the refractive index of the peripheral portion 221 between the peripheral portion 221 and the insulator film 200. The refractive index of this low refractive index layer is higher than the refractive index of the insulator film 200, and may be lower than the refractive index of the middle portion 222. Note that the material of the low refractive index layer may be the same as the material of the peripheral portion 221 (and middle portion 222), or may differ therefrom. When providing such a low refractive index layer, loss of light can be reduced. Also, this low refractive index layer may surround the peripheral portion 221.

Also, for example, the light path member 220 may have a high refractive index layer (not shown) between the peripheral portion 221 and the insulating film 200, having a higher refractive index than the refractive index of the peripheral portion 221, which is made up of a material different from the material of the peripheral portion 221. However, it can be conceived that when enormously increasing the refractive index of such a high refractive index layer as compared to the refractive index of the peripheral portion 221, and/or when enormously thickening the thickness of the high refractive index layer, light to be input to the light path member 220 is concentrated on this high refractive index layer. Therefore, an advantage according to the present embodiment may not sufficiently be obtained. Accordingly, it is desirable that refractive index difference between the peripheral portion 221 and the high refractive index layer is smaller than refractive index difference between the peripheral portion 221 and the middle portion 222. Also, it is desirable that with an arbitrary cross-section, the thickness of the high refractive index layer is thinner than the thickness of the peripheral portion 221. Such a high refractive index layer or low refractive index layer can perform a function for stipulating the shape of the peripheral portion 221, or improving adhesiveness to the opening portion 201 of the light path member 220. Also, in the event of employing an organic material (resin) as the materials of the peripheral portion 221 and middle portion 222, the above high refractive index layer or low refractive index layer serves as a protective layer (passivation layer) as to the organic materials. It is desirable to employ silicon nitride as the material of such a protective layer.

Note that a region made up of a material different from the middle portion 222, or a void which is surrounded by the middle portion 222 may exist on the inner side of the middle portion 222. However, when the refractive index of such a region is lower than the refractive index of the middle portion 222, or when the refractive index of this region is higher than the refractive index of the peripheral portion 221, it is desirable to eliminate such a region as much as possible.

The transparent film 319 common to the first through sixth embodiments will be described. As shown in FIGS. 2 and 4 through 8, the transparent film 319 is provided onto the upper surface 202 of the insulator film 200. The transparent film 319 is made up of the same material as with the peripheral portion 221 and middle portion 222, and has a higher refractive index than the refractive index of the insulator film 200 (here, eleventh insulator layer 215). The refractive index of the transparent film 319 is higher than the refractive index of the middle portion 222, and may be the same as the refractive index of the peripheral portion 221. Specifically, when assuming that the refractive index of the transparent film 319 is $n_3$, the refractive index of the middle portion 222 is $n_2$, and the refractive index of the peripheral portion 221 is $n_1$, it is desirable that $(n_1+n_2)/2 < n_3 < (3n_1-n_2)/2$ holds.

The transparent film 319 will be described in detail. As shown in the first embodiment (FIG. 2), second embodiment (FIG. 4), third embodiment (FIG. 5), fourth embodiment (FIG. 6), and sixth embodiment (FIG. 8), the transparent film 319 has a first region 3191 and a second region 3192. The second region 3192 of the transparent film 319 is continuous with the middle portion 222 which is the first high refractive index region. The first region 3191 of the transparent film 319 is continuous with the peripheral portion 221 which is the second high refractive index region, and is positioned on the insulator film 200. The refractive index of the first region 3191 is higher than the refractive index of the second region 3192, and the transparent film 319 has a refractive index distribution. The first region 3191 surrounds the second region 3192. If there is light that has propagated in a direction to be input to the upper surface 202 of the insulator film 200 instead of the opening portion 201, the transparent film 319 can guide the light to the light path member 220. Specifically, before inputting to the insulator film 200, the light attempts to propagate within the transparent film 319 (first region 3191) having a higher refractive index than the insulator film 200 having a lower refractive index to input to the first region 3191 of the transparent film 319. The light propagating through the transparent film 319 is input to the peripheral portion 221 made up of the same material as with the first region 3191 of the transparent film 319 with low loss. Therefore, the use efficiency of light can be improved. In order to obtain such an advantage, when assuming that the wavelength of light to be input to the light path member 220 is $\lambda$, and the refractive index of the transparent film 319 is $n_3$, the thickness of the transparent film 319 is equal to or greater than $\lambda/4n_3$ and also equal to or smaller than $2\lambda/n_3$. With the fifth embodiment shown in FIG. 7, the transparent film 319 is continuous with the incidence portion 2212, and the transparent film 319 has the same refractive index as with the incidence portion 2212. The transparent film 319 substantially has no refractive index distribution. As described above, in the event that the transparent film 319 has the first region 3191 and second region 3192, it is desirable that light can be concentrated on the first region 3191 continuous with the peripheral portion 221.

Seventh Embodiment

Figure 9A:
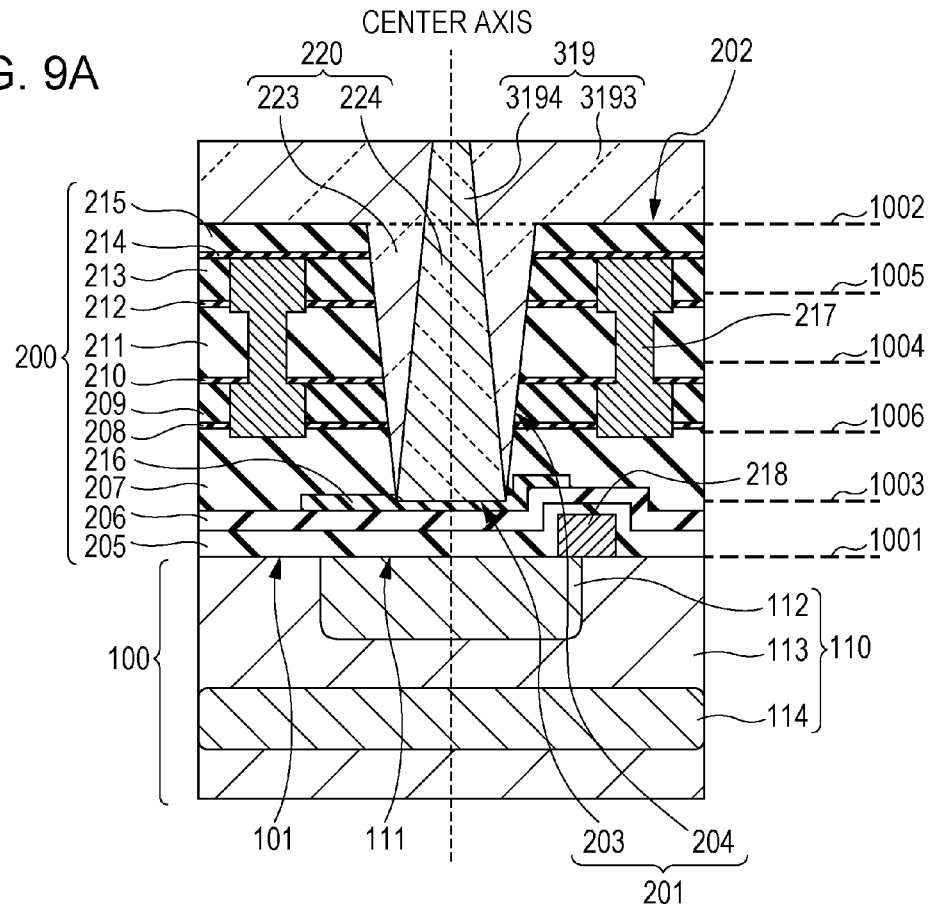
FIG. 9 (including FIG. 9A and FIG. 9B) is a cross-sectional schematic diagram of a part of a photoelectric conversion element for describing an example of a seventh embodiment.
Figure 9B:
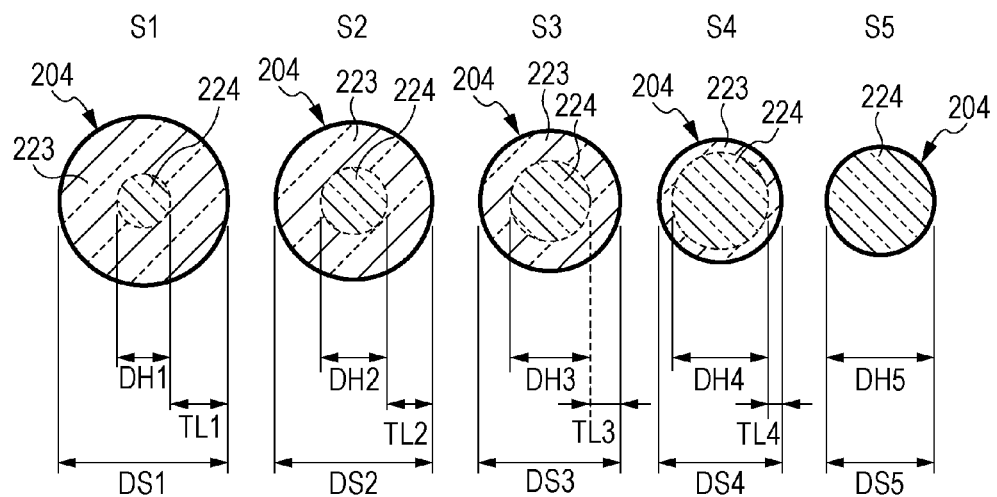

The present embodiment is an embodiment wherein the high/low relationship between the peripheral portion 221 and the middle portion 222 in the first embodiment is inverted, and will be described principally with reference to FIGS. 9A and 9B.

The light path member 220 has at least a middle portion 224 and a peripheral portion 223. The peripheral portion 223 is positioned between the middle portion 224 and the insulator film 200. The peripheral portion 223 surrounds the middle portion 224. Though the peripheral portion 223 may be made up of a material different from the middle portion 224, it is desirable that the peripheral portion 223 is made up of the same material as with the middle portion 224. It is desirable that there is no portion made up of a material different from the materials of the peripheral portion 223 and middle portion 224 at least between a portion of the peripheral portion 223 and a portion of the middle portion 224, and the same material continues from the middle portion 224 to the peripheral portion 223. In this case, it can be said that the peripheral portion 223 is continuous with the middle portion 224. It is desirable that there is no portion made up of a material different from the materials of both between the entirety of the peripheral portion 223 and the entirety of the middle portion 224.

With the present embodiment, the refractive index of the peripheral portion 223 is higher than the refractive index of the insulator film 200. The refractive index of the middle portion 224 is then higher than the refractive index of the peripheral portion 223. Therefore, the refractive index of the middle portion 224 is also higher than the refractive index of the insulator film 200. Specifically, with the present embodiment, the peripheral portion 223 is the first high refractive index region, and the middle portion 224 is the second high refractive index region having a higher refractive index than the first high refractive index region (peripheral portion 223).

The thickness of the peripheral portion 223 is consecutively thinned as the peripheral portion 223 comes closer to the light receiving surface 111. The details will be described with reference to FIG. 9B. DS1, DS2, DS3, DS4, and DS5 represent the width (diameter) of the opening portion 201 in the cross-sections S1 through S5. With the present embodiment, the side face 204 shown in FIG. 9A has a forward tapered shape as to the light receiving surface 111, and relationship of DS1>DS2>DS3>DS4>DS5 holds.

DH1, DH2, DH3, DH4, and DH5 represent the width (diameter) of the middle portion 224 in the cross-sections S1 through S5. With the present embodiment, the middle portion 224 has a truncated-cone shape, and the outer face of the middle portion 224 (the face on the peripheral portion 223 side) has a forward tapered shape as to the light receiving surface 111. Relationship of DH1<DH2<DH3<DH4<DH5 holds. TL1, TL2, TL3, TL4, and TL5 represent the thickness (width) of the peripheral portion 223 in the cross-sections S1 through S5. With the present embodiment, the inner face of the peripheral portion 223 (the face on the middle portion 224 side) and the outer face of the peripheral portion 223 (the face on the insulator film 200 side) have a reverse tapered shape as to the light receiving surface 111. Relationship of TL1>TL2>TL3>TL4>TL5 holds.

Here, though a ratio (TL1/TL5) between the maxim value (TL1) and the minimum value (TL5) of the thickness of the peripheral portion 223 is generally infinite, the minimum value of the thickness of the peripheral portion 223 is at least equal to or smaller than a half of the maximum value (maximum value/minimum value≥2). When assuming that the wavelength of light to be input to the light path member 220 is $\lambda$, and the refractive index of the insulator film 200 is $n_0$, and the refractive index of the peripheral portion 223 is $n_1$, the maximum value of the thickness of the peripheral portion 223 is greater than $\lambda/2\sqrt{(n_1^2-n_0^2)}$. Also, the minimum value of the thickness of the peripheral portion 223 is smaller than $\lambda/4\sqrt{/(n_1^2-n_0^2)}$. The thickness of the peripheral portion 223 has the maximum value at the upper portion of the light path member 220 (from the second plane 1002 to the fourth plane 1004). Also, the thickness of the peripheral portion 223 has the minimum value at the lower portion of the light path member 220 (from the fourth plane 1004 to the third plane 1003).

Even with a portion of the thickness of the peripheral portion 223 between the minimum value and the maximum value, the thickness in a plane closer to the light receiving surface 111 is equal to or smaller than ½. With the example shown in FIGS. 9A and 9B, the thickness of the peripheral portion 223 in the fourth plane 1004 (TL3) is ½ of the thickness of the peripheral portion 223 in the second plane 1002 (TL1). Also, the thickness of the peripheral portion 223 in the sixth plane 1006 (TL4) is smaller than ½ of the thickness of the peripheral portion 223 in the fifth plane 1005 (TL2).

Figure 10:
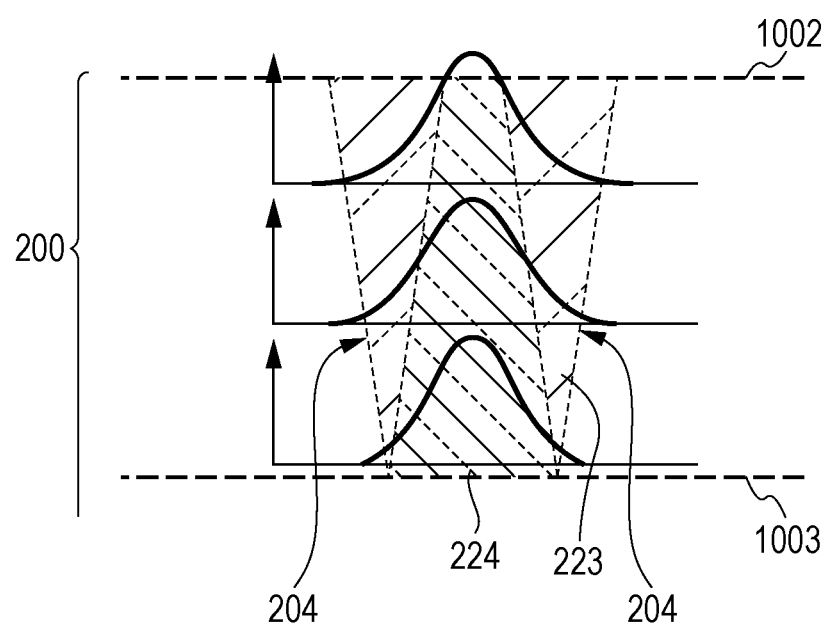
FIG. 10 is a schematic diagram for describing the seventh embodiment.

FIG. 10 illustrates, with the present embodiment, field strength distributions at the time of light in parallel with the center axis of the light path member 220 being input to the light path member 220. In detail, three field strength distributions are distributions within a plane in parallel with the light receiving surface 111 of the field strengths in three positions that differ in height within the light path member 220. A position on the lateral axis indicates a height within the light path member 220.

It can wave-optically be conceived that light is apt to concentrate on a region having a high refractive index. Therefore, the field strength of the middle portion 224 is higher than the field strength of the peripheral portion 223 at a position where the thickness of the middle portion 224 having a higher refractive index than that of the peripheral portion 223 is great. Also, most of light propagates through the middle portion 224, whereby light leaks from the light path member 220 to the insulator film 200 can be reduced. Therefore, it is thought that the loss of light is suppressed. Accordingly, the use efficiency of light to be input in parallel with the center axis of the photoelectric conversion element 1 can be improved as compared to the first through sixth embodiments. The light in parallel with the center axis of the photoelectric conversion element 1 is substantially light to be input perpendicular to the light receiving surface of the photoelectric conversion portion 110, which is typical incident light to the photoelectric conversion portion 110. Accordingly, the photoelectric conversion elements 1 having high sensitivity can be obtained.

The present inventor and others have performed study of sensitivity at the time of light in parallel with the center axis of the light path member 220 being input to the light path member 220 as to three models assuming that the wavelength of incident light is 550 nm (green light), the refractive index of the insulator film 200 is 1.46, and the refractive index of the light path member 220 is 1.83 through 1.90. The first model is a model wherein the refractive index of the middle portion, and the refractive index of the peripheral portion are both 1.83, and the light path member 220 has no refractive index distribution. The second model is a model wherein the refractive index of the middle portion, and the refractive index of the peripheral portion are both 1.90, and the light path member 220 has no refractive index distribution. The third model is a model corresponding to the present embodiment wherein the refractive index of the middle portion 224 is 1.90, and the refractive index of the peripheral portion 223 is 1.83. In the event of having performed standardization with the sensitivity of the first model as 1.00, the standardized sensitivity of the third model has been 1.05 while the standardized sensitivity of the second model has been 1.04. In this way, the third model can improve the sensitivity of the photoelectric conversion elements 1 by setting the refractive index of the middle portion 224 to be higher than the refractive index of the peripheral portion 223 regarding the first model, or setting the refractive index of the peripheral portion 223 to be lower than the refractive index of the middle portion 224 regarding the second model.

Note that an arrangement may be employed as a modification of the seventh embodiment wherein the high/low relationship in refractive index between the peripheral portion 221 and the middle portion 222 according to the second through sixth embodiments is inverted. For example, an arrangement may be made wherein the peripheral portion 221 is taken as the first high refractive index region, and the middle portion 222 and emission portion 2221 are taken as the second high refractive index region having a higher refractive index than the first high refractive index region (peripheral portion 221), according to the fourth embodiment. Alternatively, an arrangement may be made wherein the peripheral portion 221 and incidence portion 2212 are taken as the first high refractive index region, and the middle portion 222 is taken as the second high refractive index region having a higher refractive index than the first high refractive index region (peripheral portion 221), according to the fifth embodiment. Also, an arrangement may be made wherein the peripheral portion 222 and emission portion 2211 are taken as the first high refractive index region, and the middle portion 222 is taken as the second high refractive index region having a higher refractive index than the first high refractive index region (peripheral portion 221), according to the sixth embodiment.

Also, the transparent film 319 has a first region 3193 and a second region 3194. The second region 3194 of the transparent film 319 is continuous with the middle portion 224 which is the second high refractive index region. The first region 3193 of the transparent film 319 is continuous with the peripheral portion 223 which is the first high refractive index region, and positioned on the insulator film 200. The refractive index of the second region 3194 is higher than the refractive index of the first region 3193, and the transparent film 319 has a refractive index distribution. The first region 3193 surrounds the second region 3194. Thus, light input to the transparent film 319 can be guided to the middle portion 224 of the light path member 220, and the use efficiency of light can be improved.

The seventh embodiment is a mode wherein the peripheral portion 221 is in contact with the side face 204 of the insulator film 200. However, in the same way as with the first through sixth embodiments, one or more layers making up a part of the light path member may lie between the peripheral portion 223 and the side face 204 of the insulator film 200 with the peripheral portion 223 being not in contact with the side face 204 of the insulator film 200.

For example, in one embodiment, the light guiding path may have a low refractive index layer (not shown) having a lower refractive index than the refractive index of the peripheral portion 223 between the peripheral portion 221 and the insulator film 200. The refractive index of this low refractive index layer is higher than the refractive index of the insulator film 200, and may be lower than the refractive index of the middle portion 224. Note that the material of the low refractive index layer may be the same as the material of the peripheral portion 223 (and middle portion 224), or may differ therefrom. When providing such a low refractive index layer, loss of light can be reduced. Also, this low refractive index layer may surround the peripheral portion 223.

Also, for example, the wave guiding path configuration may have a high refractive index layer (not shown) having a higher refractive index than the refractive index of the peripheral portion 223, which is made up of a material different from the material of the peripheral portion 223. However, it can be conceived that when enormously increasing the refractive index of such a high refractive index layer as compared to the refractive index of the peripheral portion 223, and/or when enormously thickening the thickness of the high refractive index layer, light to be input to the light path member 220 is concentrated on this high refractive index layer. Therefore, an advantage according to the present embodiment may not sufficiently be obtained. Accordingly, it is desirable that refractive index difference between the peripheral portion 223 and the high refractive index layer is smaller than refractive index difference between the peripheral portion 223 and the middle portion 224. Also, it is desirable that with an arbitrary cross-section, the thickness of the high refractive index layer is thinner than the thickness of the peripheral portion 221. Such a high refractive index layer or low refractive index layer can perform a function for stipulating the shape of the peripheral portion 221, or improving adhesiveness to the opening portion 201 of the light path member 220. Also, in the event of employing an organic material (resin) as the materials of the peripheral portion 221 and middle portion 222, the above high refractive index layer or low refractive index layer serves as a protective layer (passivation layer) as to the organic materials. It is desirable to employ silicon nitride as the material of such a protective layer.

In order to form a refractive index distribution using silicon nitride, the following methods can be employed, for example. As for a first method, first, a first silicon nitride film is formed above the side face 204 by relatively decreasing the amount of silicon components as to the amount of nitride components of the film formation material. Thereafter, a second silicon nitride film is formed above the first silicon nitride by increasing the amount of silicon components as to the amount of nitride components of the film formation material as compared to when forming the first silicon nitride. At this time, one of the amount of nitride components, and the amount of silicon components may be the same, or both may differ at the time of forming the first silicon nitride film and at the time of forming the second silicon nitride film. According to this first method, the light path member 220 can be formed wherein the first silicon nitride film makes up the peripheral portion 223, and the second silicon nitride film makes up the middle portion 224. This is because even if the stoichiometric composition ratio is Si:N=3:4, with regard to a non-stoichiometric composition, silicon nitride of which the ratio of silicon as to nitride (Si/N) is relatively high has a higher refractive index than that of silicon nitride of which the ratio of silicon as to nitride (Si/N) is relatively low.

As for a second method, first, a first silicon nitride film of which the material density is relatively low is formed above the side face 204 by relatively increasing the input energy of the film formation material. Thereafter, a second silicon nitride film of which the material density is higher than the first silicon nitride film is formed by decreasing the input energy of the film formation material as compared to when forming the first silicon nitride film. Thus, the light path member 220 can be formed wherein the first silicon nitride film makes up the peripheral portion 223, and the second silicon nitride film makes up the middle portion 224. This is because a dense silicon nitride film where the density of silicon nitride is relatively high has a higher refractive index than a coarse nitride film where the density of silicon nitride is relatively low.

Details of Photoelectric Conversion Elements

An example of the photoelectric conversion elements 1 will be described in detail with reference to FIG. 1. An $N^+$-type semiconductor region 112 is provided into the semiconductor substrate 100 made up of N-type silicon. An N-type semiconductor region 113 is provided to circumference including the lower portion of the $N^+$-type semiconductor region 112. A P-type semiconductor region 114 is provided to the lower portion of the N-type semiconductor region 113. The $N^+$-type semiconductor region 112 can principally serve as a charge storage region. The $N^+$-type semiconductor region 112, N-type semiconductor region 113, and P-type semiconductor region 114 can make up a portion of the photoelectric conversion portion 110.

The input side surface (upper surface in FIG. 1) of the first lens substrate layer 328 has a convex ideal spherical surface, generally spherical surface, or aspherical surface toward the input side (hereafter, these will collectively be referred to as "curvilinear surface"), i.e., has a convex lens shape. Thus, light input to the lens body layer 329 comes closer to the center axis, and is condensed. The lens substrate layer 328 and lens body layer 329 are mutually made up of the same organic material (resin), and the lens substrate layer 328 and lens body layer 329 are in contact with each other. That is to say, the lens substrate layer 328 and lens body layer 329 are substantially provided as a unit. It is frequently difficult to observe the border between the lens substrate layer 328 and the lens body layer 329. In this case, a plane connecting the edges of the curvilinear surface region of the lens body layer 329 can be set as an imaginary border. Note that an arrangement may be made wherein the first lens body layer 329 and a color filter layer 327 are in contact with each other by omitting the first lens substrate layer 328.

The material properties (particularly, refractive index) and shape (particularly, curvature, height, and width thereof) of the curvilinear surface of the first lens body layer 329 greatly affect the position of a focal point. In general, the greater the curvature is set, the farther the position of a focal point is separated from the first plane 1001. The material properties (particularly, refractive index) and thickness of the lens substrate layer 328 affect distance where condensed light comes closer to the center axis within the lens substrate layer 328, and accordingly, these makes one of factors for determining a focal point. The typical refractive index of the first lens body layer 329 is 1.6 through 2.0.

The color filter layer 327 is made up of an organic material (resin) including a coloring material. Though dye can be employed as a coloring material, pigment may be employed. The material properties (particularly, refractive index) and thickness of the color filter layer 327 affect distance where light refracted at the interface between the lens substrate layer 328 and the color filter layer 327 comes closer to the center axis within the color filter layer 327, and accordingly, these becomes one of factors for determining a focal point 500. The typical thickness of the color filter layer 327 is 0.1 through 1.0 μm, and the typical refractive index is 1.4 through 1.6.

The flattened film 326 is made up of an organic material (resin), and has a function for adjusting distance between the first lens body layer 329 and the second lens body layer 324. Also, the flattened film 326 is flattened as to the curvilinear surface shape of the second lens body layer 324, and has a function for suppressing the inclination of the light path at the color filter layer 327, first lens substrate layer 328, and first lens body layer 329. The thickness of the thinnest portion of the flattened film 326 is typically 0.1 through 0.5 μm, and the refractive index of the flattened film 326 is 1.4 through 1.5.

The second lens substrate layer 323 and second lens body layer 324 are made up of silicon nitride, and the second lens body layer 324 has a convex lens shape (flat convex lens shape). Note that the refractive index of the second lens body layer 324 is higher than the refractive index of the flattened film 326. Therefore, light condensed at the first leans body layer 329 can further be condensed.

The second lens body coating layer 325 is made up of silicon oxide, and has a refractive index between the refractive index of the second lens body layer 324 and the refractive index of the flattened film 326. In this way, in the event that the second lens body coating layer 325 has a refractive index between the refractive index of the second lens body layer 324 and the refractive index of the flattened film 326, incident light from the flattened film 326 to the second lens body layer 324 increases. This is because reflection at the interface between the flattened film 326 and the second lens body layer 324 that may occur in the event that the second lens body coating layer 325 is not provided can be suppressed, and transmittance can be increased.

In one embodiment, the thickness of the second lens body coating layer 325 is smaller than the thickness of the second lens body layer 324, and the thickness of the second lens body layer 324 is equal to or smaller than ½. The thickness of the second lens body coating layer 325 is $(M-0.5)/4n_{325}$ through $(M+0.5)/4n_{325}$ times the wavelength of incident light, and the thickness may also be $M/4n_{325}$ times the wavelength of incident light. Here, M is an odd number, and $n_{325}$ is the refractive index of the second lens body coating layer 325. M is 1 or 3. In the event that the thickness of the second lens body coating layer 325 has been set in this way, interference due to reflected light on the surface of the second lens body layer 324, and reflected light on the surface of the second lens body coating layer 325 can be weakened, and accordingly, a reflection suppression function in a wave-optical viewpoint is performed.

The first middle refractive index layer 322 is provided between the second lens substrate layer 323 and the low refractive index layer 321, and the second middle refractive index layer 320 is provided between the low refractive index layer 321 and the transparent film 319. The materials of the first middle refractive index layer 322 and second middle refractive index layer 320 are made up of silicon oxynitride, and the material of the low refractive index layer 321 is silicon oxide.

The upper surface of the first middle refractive index layer 322 makes up an interface along with the lower face of the second lens substrate layer 323, and the refractive index of the first middle refractive index layer 322 is lower than the refractive index of the second lens substrate layer 323. The upper surface of the low refractive index layer 321 makes up an interface along with the lower face of the first middle refractive index layer 322, and the refractive index of the low refractive index layer 321 is lower than the refractive index of the first middle refractive index layer 322. Therefore, the first middle refractive index layer 322 has a refractive index between the refractive index of the second lens substrate layer 323 and the refractive index of the low refractive index layer 321. The upper surface of the second middle refractive index layer 320 makes up an interface along with the lower face of the low refractive index layer 321, and the refractive index of the second middle refractive index layer 320 is higher than the refractive index of the low refractive index layer 321. The lower face of the second middle refractive index layer 320 makes up an interface along with the upper surface of the transparent film 319, and the refractive index of the second middle refractive index layer 320 is lower than the refractive index of the transparent film 319. Therefore, the second middle refractive index layer 320 has a refractive index between the refractive index of the low refractive index layer 321 and the refractive index of the transparent film 319. In this way, the refractive index of any of the first middle refractive index layer 322, low refractive index layer 321, and second middle refractive index layer 320 is lower than the refractive indices of the second lens substrate layer 323 and second lens body layer 324, and accordingly, the first middle refractive index layer 322, low refractive index layer 321, and second middle refractive index layer 320 can collectively be referred to as low refractive index film. Note that at least one of the first middle refractive index layer 322 and second middle refractive index layer 320 may be omitted from the low refractive index film, and the low refractive index film may be taken as a single layer film or two-layer film. Note that the low refractive index film may also be omitted.

The refractive index of the low refractive index film 321 is lower than the refractive index of the first middle refractive index layer 322, and accordingly, light is refracted in a direction toward the center axes of the opening portion 201 and light path member 220 within the low refractive index layer 321 in accordance with the Snell's law. Therefore, the amount of light to be input to the opening portion 201 (light path member 220) can be increased. Even in the event that there is no first middle refractive index layer 322, the refractive index of the low refractive index film 321 is lower than the refractive index of the first middle refractive index layer 322, and accordingly, the same refraction can occur. However, according to the refractive-index difference between the second lens substrate layer 323 and the low refractive index layer 321, reflection of incident light may occur at the interface between the second lens substrate layer 323 and the low refractive index layer 321. Also, according to the refractive-index difference between the low refractive index layer 321 and the transparent film 319, reflection of incident light may occur at the interface between the low refractive index layer 321 and the transparent film 319. Reflectance R at this time can be represented with $R=(n_{321}-n_{319})^2/(n_{321}+n_{319})^2$. Here, $n_{321}$ is the refractive index of the low refractive index layer 321, and $n_{319}$ is the refractive index of the transparent film 319. With the example in FIG. 1, both of the refractive-index difference between the second lens substrate layer 323 and the first middle refractive index layer 322, and the refractive-index difference between the first middle refractive index layer 322 and the low refractive index layer 321 are smaller than the refractive-index difference between the second lens substrate layer 323 and the low refractive index layer 321. Accordingly, transmittance from the second lens substrate layer 323 to the low refractive index layer 321 can be improved, and the amount of light to be input to the low refractive index layer 321 can be increased. The refractive index of the transparent film 319 is higher than the refractive index of the second middle refractive index layer 320, and accordingly, light is refracted in a direction away from the center axes of the opening portion 201 and light path member 220 within the transparent film 319 in accordance with the Snell's law. Therefore, light flux to be input to the peripheral portion 221 (or peripheral portion 223) can be increased. Also, the angle as to the side face 204 can be reduced, light flux to be input to the side face 204 with an incident angle equal to or greater than the critical angle can be increased, and the amount of light to be leaked from the side face 204 of the opening portion 201 can be decreased. Even in the event that there is no second middle refractive index layer 320, the same refraction can occur by decreasing the refractive index of the low refractive index layer 321 than the refractive index of the transparent film 319. With the example in FIG. 1, both of the refractive-index difference between the low refractive index layer 321 and the second middle refractive index layer 320, and the refractive-index difference between the second middle refractive index layer 320 and the transparent film 319 are smaller than the refractive-index difference between the low refractive index layer 321 and the transparent film 319. Accordingly, transmittance from the low refractive index layer 321 to the transparent film 319 can be improved, and the amount of light to be input to the transparent film 319 can be increased.

In one embodiment, the thickness of the first middle refractive index layer 322 is $(M-0.5)/4n_{322}$ through $(M+0.5)/4n_{322}$ times the wavelength of incident light, and the thickness may also is $M/4n_{322}$ times the wavelength of incident light. Here, M is an odd number, and $n_{322}$ is the refractive index of the first middle refractive index layer 322. M is 1 or 3. In the event that the thickness of the first middle refractive index layer 322 has been set in this way, interference due to reflected light on the interface between the first middle refractive index layer 322 and the second lens substrate layer 323, and reflected light on the interface between the first middle refractive index layer 322 and the low refractive index layer 321 can be weakened, and accordingly, a reflection suppression function in a wave-optical viewpoint is performed.

Similarly, the thickness of the second middle refractive index layer 320 is $(M-0.5)/4n_{320}$ through $(M+0.5)/4n_{320}$ times the wavelength of incident light, and the thickness thereof may be $M/4n_{320}$ times the wavelength of incident light. Here, M is an odd number, and $n_{320}$ is the refractive index of the second middle refractive index layer 320. M is 1 or 3.

In order to increase refraction so as to come closer to the center axis within the low refractive index film in a range where the thickness of each layer is restricted, it is desirable to set the thickness of the first middle refractive index layer 322, and the thickness of the low refractive index layer 321 as follows. First, the relative refractive index between the second lens substrate layer 323 and the first middle refractive index layer 322, and the relative refractive index between the first middle refractive index layer 322 and the low refractive index layer 321 are compared. The thickness of the medium on the output side where the relative refractive index is greater (one of the first middle refractive index layer 322 and the low refractive index layer 321) is set so as to be greater than the thickness of the medium on the output side where the relative refractive index is smaller (the other of the first middle refractive index layer 322 and the low refractive index layer 321). Note that the relative refractive index mentioned here is (the refractive index of the input side medium)/(the refractive index of the output side medium), and is a value greater than 1 in the present embodiment. Note that, with the previous description, let us say that in the event of having simply been described as refractive index, this means an absolute refractive index. According to the Snell's law, the greater the relative refractive index is, the greater the output angle is, whereby emitted light can further come closer to the center axis by increasing the thickness of the output side medium where the above relative refractive index is greater. For example, in the event that the refractive index of the second lens substrate layer 323 is 2.00, the refractive index of the first middle refractive index layer 322 is 1.72, and the refractive index of the low refractive index layer 321 is 1.46, 2.00/1.72<1.72/1.46 holds. Accordingly, the thickness of the low refractive index layer 321 should be increased as compared to the thickness of the first middle refractive index layer 322.

Photoelectric Conversion Apparatus and Image Sensing System

Figure 11:
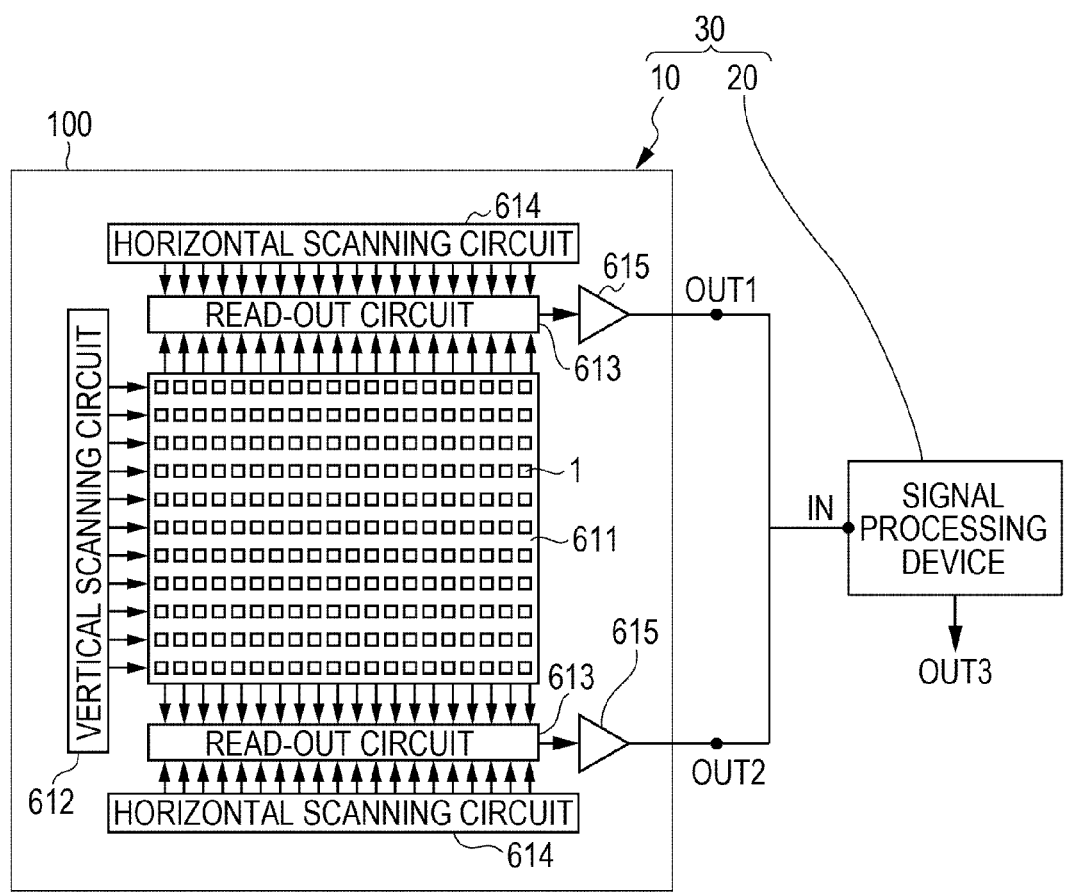
FIG. 11 is a schematic diagram for describing an example of a photoelectric conversion apparatus and an image sensing system.

An example of a photoelectric conversion apparatus 10 and an image sensing system 30 employing this will be described with reference to FIG. 11. The photoelectric conversion apparatus 10 can be employed, for example, as an imaging sensor, ranging sensor, or photometry sensor. The photoelectric conversion apparatus 10 may also have multiple functions of the functions as an imaging sensor, ranging sensor, or photometry sensor.

The image sensing system 30 including the photoelectric conversion apparatus 10, and a signal processing device 20, to which the electric signal output from the photoelectric conversion apparatus 10 is input, for processing this electric signal, may also be built. FIG. 9 is a diagram illustrating an example of the image sensing system 30. Electric signals are output from OUT1 and OUT2 of the photoelectric conversion apparatus 10. Though an example has been shown here wherein the two output routes of OUT1 and OUT2 are provided, the number of output routes may be one, or may be three or more. Electric signals are input to IN of the signal processing device 20. The electric signals may be current signals or voltage signals, and may be analog signals or digital signals. Light signals may be employed instead of electric signals.

In the event of employing the photoelectric conversion apparatus 10 as an image sensor, the signal processing device 20 is configured so as to output image signals from OUT3 by inputting electric signals to IN. In the event of employing the photoelectric conversion apparatus 10 as a ranging sensor for focal point detection, the signal processing device 20 is configured so as to output from OUT3 a driving signal for driving a lens provided in front of the photoelectric conversion apparatus 10 by inputting electric signals to IN. In the event of employing the photoelectric conversion apparatus 10 as a photometry sensor, the signal processing device 20 is configured so as to output a control signal for controlling a shutter to adjust exposure time from OUT3 by inputting electric signals to IN. Note that the above shutter may be a mechanical shutter or electronic shutter, and in the case of an electronic shutter, the photoelectric conversion apparatus 10 is substantially controlled. It is particularly suitable to employ the photoelectric conversion apparatus 10 according to the present invention as an image sensor, and satisfactory images can be obtained.

An example of the photoelectric conversion apparatus 10 in the image sensing system 30 shown in FIG. 11 will be described. With the present example, a pixel-amplification-type photoelectric conversion apparatus serving as the photoelectric conversion apparatus 10 is employed as an image sensor. In FIG. 11, the photoelectric conversion apparatus 10 includes a pixel region 611, a vertical scanning circuit 612, two readout circuits 613, two horizontal scanning circuits 614, and two output amplifiers 615. A region other than the pixel region 611 will be referred to as a peripheral circuit region.

With the pixel region 611, a great number of photoelectric conversion elements 1 are arrayed in a two-dimensional manner. Each of the photoelectric conversion elements 1 is equivalent to one pixel. The interval between the center axes of mutually adjacent photoelectric conversion elements 1 (pixel pitch) is typically equal to or smaller than 10 μm, equal to or smaller than 5.0 μm, and may be equal to or smaller than 2.0 μm. With the peripheral circuit region, the readout circuits 613, and for example, a column amplifier, a CDS circuit, an adder circuit, and so forth are provided, which subject a signal read out via a vertical signal line from a pixel in the row selected by the vertical scanning circuit 612 to amplification, addition, or the like. The column amplifier, CDS circuit, adder circuit, and so forth are disposed for every pixel column or every multiple pixel columns. The horizontal scanning circuits 614 generate a signal for sequentially reading out the signals of the readout circuits 613. The output amplifiers 615 amplify and output signals in the columns selected by the horizontal scanning circuits 614.

The above configuration is just a configuration example of the photoelectric conversion apparatus 10, and the present invention is not restricted to this. The readout circuits 613, horizontal scanning circuits 614, and output amplifiers 615 make up the output routes (OUT1 and OUT2) of two systems, and accordingly, these are disposed above and below one at a time, sandwiching the pixel region 611 therebetween.

Examples of the typical image sensing system 30 include cameras such as still cameras, video cameras, and so forth. The image sensing system 30 can also include a transportation unit (not shown) which enables the photoelectric conversion apparatus 10 to be transported. Examples of the movement unit include wheels with an electric motor, reciprocating engine, rotary engine, or the like as a power source, and also include propulsion devices such as propellers, turbine engines, rocket engines, and so forth. Such an image sensing system including the movement unit can be realized by mounting the photoelectric conversion apparatus 10 and signal processing device 20 on an automobile, rail car, ship, aircraft, satellite, or the like.

As described above, with the present invention which can have the first through seventh embodiments, photoelectric conversion elements having high light use efficiency can be obtained. Especially, with the first through sixth embodiments included in the first viewpoint of the present invention, photoelectric conversion elements with F value linearity having been improved can be provided. Also, with the seventh embodiment included in the second viewpoint of the present invention, photoelectric conversion elements with sensitivity as to light in parallel with the center axis having been improved can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A photoelectric conversion apparatus having a pixel area where pixels are arrayed comprising:
    a photoelectric conversion portion included in a pixel of the arrayed pixels;
    a member for light path to the photoelectric conversion portion, which is provided on the photoelectric conversion portion;
    an insulator film; and
    a wiring;
    wherein within one plane in parallel with a light receiving surface of the photoelectric conversion portion, and within another plane in parallel with the light receiving surface and closer to the light receiving surface than the one plane, the wiring is arranged in the pixel area, and the insulator film surrounds the member,
    wherein a width of the member within the another plane is less than a width of the member within the one plane,
    wherein the member includes
        a first portion, and
        a second portion, the second portion being different from the first portion in a refractive index, the second portion being arranged in continuous with the first portion and surrounding the first portion, and
    wherein a width of the first portion within the another plane is more than a width of the first portion within the one plane, and a thickness of the second portion within the another plane is not more than a half of a thickness of the second portion within the one plane.

2. The photoelectric conversion apparatus according to claim 1, wherein a refractive index of the second portion is higher than a refractive index of the first portion.

3. The photoelectric conversion apparatus according to claim 1, wherein a material of the first portion and the second portion is silicon nitride.

4. The photoelectric conversion apparatus according to claim 3, wherein a silicon index as to nitride in the second portion is different from silicon index as to nitride in the first portion.

5. The photoelectric conversion apparatus according to claim 3, wherein a density of silicon nitride in the second portion is different from a density of silicon nitride in the first portion.

6. The photoelectric conversion apparatus according to claim 3, wherein a cross-sectional observation image of the member in a direction perpendicular to the light receiving surface by an electron microscope shows a contrast between the first portion and the second portion.

7. The photoelectric conversion apparatus according to claim 1,
    wherein the member is provided within an opening portion of the insulator film, which is formed of a side face continuous from an upper face of the insulator film, and a bottom face continuous with the side face;
    wherein with a plane including the light receiving surface being taken as a first plane, a plane including the upper face, in parallel with the first plane, being taken as a second plane, a plane including the bottom face, in parallel with the first plane and positioned between the first plane and the second plane, being taken as a third plane, a plane positioned in equal distance from the second plane and the third plane, in parallel with the first plane, is taken as a fourth plane;
    wherein the one plane is positioned between the second plane and the fourth plane, and the another plane is positioned between the third plane and the fourth plane.

8. The photoelectric conversion apparatus according to claim 1,
    wherein with a plane positioned in equal distance from the second plane and the fourth plane, in parallel with the first plane, is taken as a fifth plane, the first portion, the second portion and the wiring is arranged in the fifth portion.

9. The photoelectric conversion apparatus according to claim 1,
    wherein the insulator film is a multilayer film including a first insulator layer arranged within the one plane, a second insulator layer arranged within the another plane, a third insulator layer and a fourth insulator layer, the first insulator layer being positioned between the third insulator layer and the fourth insulator layer,
    wherein refractive indexes of the third insulator layer and the fourth insulator layer are higher than refractive indexes of the first insulator layer and the second insulator layer, and thicknesses of the third insulator layer and the fourth insulator layer are less than thicknesses of the first insulator layer and the second insulator layer,
    wherein the first insulator layer, the second insulator layer, the third insulator layer and the fourth insulator layer surround the member.

10. The photoelectric conversion apparatus according to claim 1,
    wherein the wiring including a first wiring layer containing copper as a principal component, and a second wiring layer containing copper as a principal component,
    wherein the insulator film is a multilayer film including a first insulator layer arranged within the one plane, a second insulator layer arranged within the another plane, a third insulator layer and a fourth insulator layer, the first insulator layer being positioned between the third insulator layer and the fourth insulator layer, wherein the third insulator layer is in contact with the first wiring layer, and the fourth insulator layer is in contact with the second wiring layer, and thicknesses of the third insulator layer and the fourth insulator layer are less than thicknesses of the first insulator layer and the second insulator layer, wherein the first insulator layer, the second insulator layer, the third insulator layer and the fourth insulator layer surround the member.

11. The photoelectric conversion apparatus according to claim 1, wherein the member includes a third portion (2211) between the first portion and the photoelectric conversion portion, the third portion being different from the first portion in at least one of a refractive index, a non-stoichiometric composition, a crystallinity, a density, a material of an impurity, a density of an impurity.

12. The photoelectric conversion apparatus according to claim 1, wherein the insulator film has an opening portion where the member is arranged, a transparent film is disposed out of the opening portion, and the transparent film has a first region on the opening portion and a second region on the insulator film, and wherein the first region is continuous with the first portion, and the second region is continuous with the second portion.

13. The photoelectric conversion apparatus according to claim 3, wherein the insulator film has an opening portion where the member is arranged, a silicon nitride film (319) is disposed out of the opening portion, and the silicon nitride film has a first region on the opening portion and a second region on the insulator film.

14. The photoelectric conversion apparatus according to claim 13, wherein a silicon oxide film (321) is disposed on the silicon nitride film.

15. The photoelectric conversion apparatus according to claim 1, wherein the second portion is in contact with the insulator film.

16. The photoelectric conversion apparatus according to claim 1, wherein the thickness of the second portion continuously increases with distance from the light receiving surface.

17. The photoelectric conversion apparatus according to claim 1, further comprising:

a first lens body layer provided on an opposite side of the photoelectric conversion portion as to the member; and a second lens body layer positioned between the first lens body layer and the member.

18. The photoelectric conversion apparatus according to claim 1, wherein an interval of axes passing through the first portion within the one plane and the another plane, perpendicular to the light receiving surface of each of mutually adjacent pixels, is equal to or smaller than 5.0 um.

19. An image sensing system comprising:

a photoelectric conversion apparatus according to claim 1; and a signal processing device where a signal output from the photoelectric conversion apparatus is input, and the signal is processed.

20. The image sensing system according to claim 1, wherein the signal processing device is configured so that the photoelectric conversion apparatus has multiple functions among a function of an imaging sensor, a function of a ranging sensor and a function of a photometry sensor.

* * * * *